(12) United States Patent
Johnson et al.

(10) Patent No.: US 9,634,296 B2
(45) Date of Patent: Apr. 25, 2017

(54) THIN FILM BATTERY ON AN INTEGRATED CIRCUIT OR CIRCUIT BOARD AND METHOD THEREOF

(71) Applicant: Infinite Power Solutions, Inc., Littleton, CO (US)

(72) Inventors: Raymond R. Johnson, Denver, CO (US); Shawn W. Snyder, Golden, CO (US); Paul C. Brantner, Conifer, CO (US); Timothy J. Bradow, Littleton, CO (US); Bernd J. Neudecker, Littleton, CO (US)

(73) Assignee: Sapurast Research LLC, Wilmington, DE (US)

( * ) Notice: Subject to any disclaimer, the term of this patent is extended or adjusted under 35 U.S.C. 154(b) by 349 days.

(21) Appl. No.: 14/191,069

(22) Filed: Feb. 26, 2014

(65) Prior Publication Data

US 2014/0295246 A1    Oct. 2, 2014

Related U.S. Application Data

(60) Division of application No. 11/748,471, filed on May 14, 2007, now abandoned, and a continuation-in-part
(Continued)

(51) Int. Cl.
*H01M 2/08*        (2006.01)
*H01M 2/20*        (2006.01)
(Continued)

(52) U.S. Cl.
CPC .......... *H01M 2/0207* (2013.01); *H01L 23/58* (2013.01); *H01M 2/08* (2013.01); *H01M 2/26* (2013.01);
(Continued)

(58) Field of Classification Search
CPC ........... H01M 10/0435; H01M 10/052; H01M 10/425; H01M 10/0858; H01M 2/08;
(Continued)

(56) References Cited

U.S. PATENT DOCUMENTS 712,316 A    10/1902 Loppe et al.
1,712,316 A    10/1902 Loppe et al.
(Continued)

FOREIGN PATENT DOCUMENTS

CN    1415124    4/2003
CN    1532984    9/2004
(Continued)

OTHER PUBLICATIONS

Laurikaitis et al. "Physical properties of zirconium oxynitride films deposited by reactive magnetron sputtering." Journal of Physics: Conference Series 100, 062051. (2008).
(Continued)

*Primary Examiner* — Sean P Cullen
(74) *Attorney, Agent, or Firm* — Blakely, Sokoloff, Taylor & Zafman LLP

(57) ABSTRACT

The present invention relates to flexible thin film batteries on semiconducting surface or the conductive or insulating packaging surface of a semiconductor device and methods of constructing such batteries. Electrochemical devices may be glued to a semiconducting surface or the conductive or insulating packaging surface of a semiconductor device or deposited directly thereon. The invention also relates to flexible thin film batteries on flexible printed circuit board where the electrochemical devices may also be glued or deposited on the flexible printed circuit board.

13 Claims, 5 Drawing Sheets

Related U.S. Application Data of application No. 11/687,032, filed on Mar. 16, 2007, now Pat. No. 8,236,443, and a continuation-in-part of application No. 11/561,277, filed on Nov. 17, 2006, now Pat. No. 8,445,130, and a continuation-in-part of application No. 11/209,536, filed on Aug. 23, 2005, now Pat. No. 8,021,778, which is a continuation of application No. 11/374,282, filed on Jun. 15, 2005, now abandoned, which is a continuation-in-part of application No. 10/215,190, filed on Aug. 9, 2002, now Pat. No. 6,916,679.

(60) Provisional application No. 60/799,904, filed on May 12, 2006, provisional application No. 60/782,792, filed on Mar. 16, 2006, provisional application No. 60/737,613, filed on Nov. 17, 2005, provisional application No. 60/759,479, filed on Jan. 17, 2006.

(51) Int. Cl.
*H01M 2/26* (2006.01)
*H01M 6/40* (2006.01)
*H01M 10/04* (2006.01)
*H01L 23/58* (2006.01)
*H01M 2/02* (2006.01)
*H01M 10/052* (2010.01)
*H01M 10/0562* (2010.01)
*H01M 10/42* (2006.01)
*H01M 10/0585* (2010.01)
*H01M 10/0525* (2010.01)

(52) U.S. Cl.
CPC ......... *H01M 6/40* (2013.01); *H01M 10/0436* (2013.01); *H01M 10/052* (2013.01); *H01M 10/0525* (2013.01); *H01M 10/0562* (2013.01); *H01M 10/0585* (2013.01); *H01M 10/425* (2013.01); *H01L 2924/0002* (2013.01); *H01M 2220/30* (2013.01); *H01M 2300/0068* (2013.01); *Y02P 70/54* (2015.11); *Y10T 29/4911* (2015.01); *Y10T 29/49114* (2015.01)

(58) Field of Classification Search
CPC ........ H01M 2/0207; H01M 2/26; H01M 6/40; H01L 23/58
USPC ...... 429/149, 162, 124, 163; 29/623.2, 623.4
See application file for complete search history.

(56) References Cited

U.S. PATENT DOCUMENTS

| | | |
|---|---|---|
| 2,970,180 A | 1/1961 | Urry |
| 3,309,302 A | 3/1967 | Heil |
| 3,616,403 A | 10/1971 | Collins et al. |
| 3,790,432 A | 2/1974 | Fletcher et al. |
| 3,797,091 A | 3/1974 | Gavin |
| 3,850,604 A | 11/1974 | Klein |
| 3,939,008 A | 2/1976 | Longo et al. |
| 4,082,569 A | 4/1978 | Evans, Jr. |
| 4,111,523 A | 9/1978 | Kaminow et al. |
| 4,127,424 A | 11/1978 | Ullery, Jr. |
| 4,226,924 A | 10/1980 | Kimura et al. |
| 4,283,216 A | 8/1981 | Brereton |
| 4,318,938 A | 3/1982 | Barnett et al. |
| 4,328,297 A | 5/1982 | Bilhorn |
| 4,395,713 A | 7/1983 | Nelson et al. |
| 4,437,966 A | 3/1984 | Hope et al. |
| 4,442,144 A | 4/1984 | Pipkin |
| 4,467,236 A | 8/1984 | Kolm et al. |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |
| 5,119,460 A | 6/1992 | Bruce et al. |
| 5,124,782 A | 6/1992 | Hundt et al. |
| 5,147,985 A | 9/1992 | DuBrucq |
| 5,153,710 A | 10/1992 | McCain |
| 5,169,408 A | 12/1992 | Biggerstaff et al. |
| 5,171,413 A | 12/1992 | Arntz et al. |
| 5,173,271 A | 12/1992 | Chen et al. |
| 5,174,876 A | 12/1992 | Buchal et al. |
| 5,180,645 A | 1/1993 | Moré |
| 5,187,564 A | 2/1993 | McCain |
| 5,196,041 A | 3/1993 | Tumminelli et al. |
| 5,196,374 A | 3/1993 | Hundt et al. |
| 5,200,029 A | 4/1993 | Bruce et al. |
| 5,202,201 A | 4/1993 | Meunier et al. |
| 5,206,925 A | 4/1993 | Nakazawa et al. |
| 5,208,121 A | 5/1993 | Yahnke et al. |
| 5,217,828 A | 6/1993 | Sangyoji et al. |
| 5,221,891 A | 6/1993 | Janda et al. |
| 5,225,288 A | 7/1993 | Beeson et al. |
| 5,227,264 A | 7/1993 | Duval et al. |
| 5,237,439 A | 8/1993 | Misono et al. |
| 5,252,194 A | 10/1993 | Demaray et al. |
| 5,262,254 A | 11/1993 | Koksbang et al. |
| 5,273,608 A | 12/1993 | Nath |
| 5,287,427 A | 2/1994 | Atkins et al. |
| 5,296,089 A | 3/1994 | Chen et al. |
| 5,300,461 A | 4/1994 | Ting |
| 5,302,474 A | 4/1994 | Shackle et al. |
| 5,303,319 A | 4/1994 | Ford et al. |
| 5,306,569 A | 4/1994 | Hiraki |
| 5,307,240 A | 4/1994 | McMahon |
| 5,309,302 A | 5/1994 | Vollmann |
| 5,314,765 A | 5/1994 | Bates |
| 5,326,652 A | 7/1994 | Lake |
| 5,326,653 A | 7/1994 | Chang |
| 5,338,624 A | 8/1994 | Gruenstern et al. |
| 5,338,625 A | 8/1994 | Bates et al. |
| 5,342,709 A | 8/1994 | Yahnke et al. |
| 5,355,089 A | 10/1994 | Treger et al. |
| 5,360,686 A | 11/1994 | Peled et al. |
| 5,362,579 A | 11/1994 | Rossoll et al. |
| 5,381,262 A | 1/1995 | Arima et al. |
| 5,387,482 A | 2/1995 | Anani |
| 5,401,595 A | 3/1995 | Kagawa et al. |
| 5,403,680 A | 4/1995 | Otagawa et al. |
| 5,411,537 A | 5/1995 | Munshi et al. |

(56) References Cited

U.S. PATENT DOCUMENTS

| | | |
|---|---|---|
| 5,411,592 A | 5/1995 | Ovshinsky et al. |
| 5,419,982 A | 5/1995 | Tura et al. |
| 5,427,669 A | 6/1995 | Drummond |
| 5,435,826 A | 7/1995 | Sakakibara et al. |
| 5,437,692 A | 8/1995 | Dasgupta et al. |
| 5,445,856 A | 8/1995 | Chaloner-Gill |
| 5,445,906 A | 8/1995 | Hobson et al. |
| 5,448,110 A | 9/1995 | Tuttle et al. |
| 5,449,576 A | 9/1995 | Anani |
| 5,455,126 A | 10/1995 | Bates et al. |
| 5,457,569 A | 10/1995 | Liou et al. |
| 5,458,995 A | 10/1995 | Behl et al. |
| 5,464,692 A | 11/1995 | Huber |
| 5,464,706 A | 11/1995 | Dasgupta et al. |
| 5,470,396 A | 11/1995 | Mongon et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,493,177 A | 2/1996 | Muller et al. |
| 5,498,489 A | 3/1996 | Dasgupta et al. |
| 5,499,207 A | 3/1996 | Miki et al. |
| 5,501,918 A | 3/1996 | Gruenstern et al. |
| 5,504,041 A | 4/1996 | Summerfelt |
| 5,512,147 A | 4/1996 | Bates et al. |
| 5,512,387 A | 4/1996 | Ovshinsky |
| 5,512,389 A | 4/1996 | Dasgupta et al. |
| 5,538,796 A | 7/1996 | Schaffer et al. |
| 5,540,742 A | 7/1996 | Sangyoji et al. |
| 5,547,780 A | 8/1996 | Kagawa et al. |
| 5,547,781 A | 8/1996 | Blonsky et al. |
| 5,547,782 A | 8/1996 | Dasgupta et al. |
| 5,552,242 A | 9/1996 | Ovshinsky et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,567,210 A | 10/1996 | Bates et al. |
| 5,569,520 A | 10/1996 | Bates |
| 5,582,935 A | 12/1996 | Dasgupta et al. |
| 5,591,520 A | 1/1997 | Migliorini et al. |
| 5,597,660 A | 1/1997 | Bates et al. |
| 5,597,661 A | 1/1997 | Takeuchi et al. |
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates et al. |
| 5,612,153 A | 3/1997 | Moulton et al. |
| 5,613,995 A | 3/1997 | Bhandarkar et al. |
| 5,616,933 A | 4/1997 | Li |
| 5,618,382 A | 4/1997 | Mintz et al. |
| 5,625,202 A | 4/1997 | Chai |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A | 8/1997 | Shimizu et al. |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |
| 5,716,728 A | 2/1998 | Smesko |
| 5,718,813 A | 2/1998 | Drummond et al. |
| 5,719,976 A | 2/1998 | Henry et al. |
| 5,721,067 A | 2/1998 | Jacobs et al. |
| RE35,746 E | 3/1998 | Lake |
| 5,731,661 A | 3/1998 | So et al. |
| 5,738,731 A | 4/1998 | Shindo et al. |
| 5,742,094 A | 4/1998 | Ting |
| 5,755,938 A | 5/1998 | Fukui et al. |
| 5,755,940 A | 5/1998 | Shindo |
| 5,757,126 A | 5/1998 | Harvey, III et al. |
| 5,762,768 A | 6/1998 | Goy et al. |
| 5,763,058 A | 6/1998 | Isen et al. |
| 5,771,562 A | 6/1998 | Harvey, III et al. |
| 5,776,278 A | 7/1998 | Tuttle et al. |
| 5,779,839 A | 7/1998 | Tuttle et al. |
| 5,790,489 A | 8/1998 | O'Connor |
| 5,792,550 A | 8/1998 | Phillips et al. |
| 5,805,223 A | 9/1998 | Shikakura et al. |
| 5,811,177 A | 9/1998 | Shi et al. |
| 5,814,195 A | 9/1998 | Lehan et al. |
| 5,830,330 A | 11/1998 | Lantsman |
| 5,831,262 A | 11/1998 | Greywall et al. |
| 5,834,137 A | 11/1998 | Zhang et al. |
| 5,841,931 A | 11/1998 | Foresi et al. |
| 5,842,118 A | 11/1998 | Wood, Jr. |
| 5,845,990 A | 12/1998 | Hymer |
| 5,847,865 A | 12/1998 | Gopinath et al. |
| 5,849,163 A | 12/1998 | Ichikawa et al. |
| 5,851,896 A | 12/1998 | Summerfelt |
| 5,853,830 A | 12/1998 | McCaulley et al. |
| 5,855,744 A | 1/1999 | Halsey et al. |
| 5,856,705 A | 1/1999 | Ting |
| 5,864,182 A | 1/1999 | Matsuzaki |
| 5,865,860 A | 2/1999 | Delnick |
| 5,870,273 A | 2/1999 | Sogabe et al. |
| 5,874,184 A | 2/1999 | Takeuchi et al. |
| 5,882,721 A | 3/1999 | Delnick |
| 5,882,946 A | 3/1999 | Otani |
| 5,889,383 A | 3/1999 | Teich |
| 5,895,731 A | 4/1999 | Clingempeel |
| 5,897,522 A | 4/1999 | Nitzan |
| 5,900,057 A | 5/1999 | Buchal et al. |
| 5,909,346 A | 6/1999 | Malhotra et al. |
| 5,916,704 A | 6/1999 | Lewin et al. |
| 5,923,964 A | 7/1999 | Li |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsmann |
| 5,948,464 A | 9/1999 | Delnick |
| 5,948,562 A | 9/1999 | Fulcher et al. |
| 5,952,778 A | 9/1999 | Haskal et al. |
| 5,955,217 A | 9/1999 | Lerberghe |
| 5,961,672 A | 10/1999 | Skotheim et al. |
| 5,961,682 A | 10/1999 | Lee et al. |
| 5,966,491 A | 10/1999 | DiGiovanni |
| 5,970,393 A | 10/1999 | Khorrami et al. |
| 5,973,913 A | 10/1999 | McEwen et al. |
| 5,977,582 A | 11/1999 | Flemming et al. |
| 5,982,144 A | 11/1999 | Johnson et al. |
| 5,985,484 A | 11/1999 | Young et al. |
| 5,985,485 A | 11/1999 | Ovshinsky et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,007,945 A | 12/1999 | Jacobs et al. |
| 6,013,949 A | 1/2000 | Tuttle |
| 6,019,284 A | 2/2000 | Freeman et al. |
| 6,023,610 A | 2/2000 | Wood, Jr. |
| 6,024,844 A | 2/2000 | Drummond et al. |
| 6,025,094 A | 2/2000 | Visco et al. |
| 6,028,990 A | 2/2000 | Shahani et al. |
| 6,030,421 A | 2/2000 | Gauthier et al. |
| 6,033,768 A | 3/2000 | Muenz et al. |
| 6,042,965 A | 3/2000 | Nestler et al. |
| 6,045,626 A | 4/2000 | Yano et al. |
| 6,045,652 A | 4/2000 | Tuttle et al. |
| 6,045,942 A | 4/2000 | Miekka et al. |
| 6,046,081 A | 4/2000 | Kuo |
| 6,046,514 A | 4/2000 | Rouillard et al. |

(56) References Cited

U.S. PATENT DOCUMENTS

| | | |
|---|---|---|
| 6,048,372 A | 4/2000 | Mangahara et al. |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,075,973 A | 6/2000 | Greeff et al. |
| 6,077,106 A | 6/2000 | Mish |
| 6,077,642 A | 6/2000 | Ogata et al. |
| 6,078,791 A | 6/2000 | Tuttle et al. |
| 6,080,508 A | 6/2000 | Dasgupta et al. |
| 6,080,643 A | 6/2000 | Noguchi et al. |
| 6,093,944 A | 7/2000 | VanDover |
| 6,094,292 A | 7/2000 | Goldner et al. |
| 6,096,569 A | 8/2000 | Matsuno et al. |
| 6,100,108 A | 8/2000 | Mizuno et al. |
| 6,106,933 A | 8/2000 | Nagai et al. |
| 6,110,531 A | 8/2000 | Paz De Araujo |
| 6,115,616 A | 9/2000 | Halperin et al. |
| 6,117,279 A | 9/2000 | Smolanoff et al. |
| 6,118,426 A | 9/2000 | Albert et al. |
| 6,120,890 A | 9/2000 | Chen et al. |
| 6,129,277 A | 10/2000 | Grant et al. |
| 6,133,670 A | 10/2000 | Rodgers et al. |
| 6,137,671 A | 10/2000 | Staffiere |
| 6,144,916 A | 11/2000 | Wood, Jr. et al. |
| 6,146,225 A | 11/2000 | Sheats et al. |
| 6,148,503 A | 11/2000 | Delnick et al. |
| 6,156,452 A | 12/2000 | Kozuki et al. |
| 6,157,765 A | 12/2000 | Bruce et al. |
| 6,159,635 A | 12/2000 | Dasgupta et al. |
| 6,160,373 A | 12/2000 | Dunn et al. |
| 6,162,709 A | 12/2000 | Raoux et al. |
| 6,165,566 A | 12/2000 | Tropsha |
| 6,168,884 B1 | 1/2001 | Neudecker et al. |
| 6,169,474 B1 | 1/2001 | Greeff et al. |
| 6,175,075 B1 | 1/2001 | Shiotsuka et al. |
| 6,176,986 B1 | 1/2001 | Watanabe et al. |
| 6,181,283 B1 | 1/2001 | Johnson et al. |
| 6,192,222 B1 | 2/2001 | Greeff et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,210,832 B1 | 4/2001 | Visco et al. |
| 6,214,061 B1 | 4/2001 | Visco et al. |
| 6,214,660 B1 | 4/2001 | Uemoto et al. |
| 6,218,049 B1 | 4/2001 | Bates et al. |
| 6,220,516 B1 | 4/2001 | Tuttle et al. |
| 6,223,317 B1 | 4/2001 | Pax et al. |
| 6,228,532 B1 | 5/2001 | Tsuji et al. |
| 6,229,987 B1 | 5/2001 | Greeff et al. |
| 6,232,242 B1 | 5/2001 | Hata et al. |
| 6,235,432 B1 | 5/2001 | Kono et al. |
| 6,236,793 B1 | 5/2001 | Lawrence et al. |
| 6,242,128 B1 | 6/2001 | Tura et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,481 B1 | 6/2001 | Visco et al. |
| 6,248,640 B1 | 6/2001 | Nam |
| 6,249,222 B1 | 6/2001 | Gehlot |
| 6,252,564 B1 | 6/2001 | Albert et al. |
| 6,258,252 B1 | 7/2001 | Miyasaka et al. |
| 6,261,917 B1 | 7/2001 | Quek et al. |
| 6,264,709 B1 | 7/2001 | Yoon et al. |
| 6,265,652 B1 | 7/2001 | Kurata et al. |
| 6,268,695 B1 | 7/2001 | Affinito |
| 6,271,053 B1 | 8/2001 | Kondo |
| 6,271,793 B1 | 8/2001 | Brady et al. |
| 6,271,801 B2 | 8/2001 | Tuttle et al. |
| 6,280,585 B1 | 8/2001 | Obinata |
| 6,280,875 B1 | 8/2001 | Kwak et al. |
| 6,281,142 B1 | 8/2001 | Basceri |
| 6,284,406 B1 | 9/2001 | Xing et al. |
| 6,287,986 B1 | 9/2001 | Mihara |
| 6,289,209 B1 | 9/2001 | Wood, Jr. |
| 6,290,821 B1 | 9/2001 | McLeod |
| 6,290,822 B1 | 9/2001 | Fleming et al. |
| 6,291,098 B1 | 9/2001 | Shibuya et al. |
| 6,294,722 B1 | 9/2001 | Kondo et al. |
| 6,296,949 B1 | 10/2001 | Bergstresser et al. |
| 6,296,967 B1 | 10/2001 | Jacobs et al. |
| 6,296,971 B1 | 10/2001 | Hara |
| 6,300,215 B1 | 10/2001 | Shin |
| 6,302,939 B1 | 10/2001 | Rabin |
| 6,306,265 B1 | 10/2001 | Fu et al. |
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,340,880 B1 | 1/2002 | Higashijima et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greeff et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,379,846 B1 | 4/2002 | Terahara et al. |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greeff et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |

(56) References Cited

U.S. PATENT DOCUMENTS

| | | |
|---|---|---|
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,480,699 B1 | 11/2002 | Lovoi |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,529,827 B1 | 3/2003 | Beason et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,569,570 B2 | 5/2003 | Sonobe et al. |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,608,470 B1 | 8/2003 | Oglesbee et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,642,895 B2 | 11/2003 | Zurcher et al. |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jensen et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,890,385 B2 | 5/2005 | Tsuchiya et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jensen et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jensen |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |

(56) References Cited

U.S. PATENT DOCUMENTS

| | | |
|---|---|---|
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,389,580 B2 | 6/2008 | Jenson et al. |
| 7,400,253 B2 | 7/2008 | Cohen |
| 7,410,730 B2 | 8/2008 | Bates |
| RE40,531 E | 10/2008 | Graff et al. |
| 7,466,274 B2 | 12/2008 | Lin et al. |
| 7,468,221 B2 | 12/2008 | LaFollette et al. |
| 7,494,742 B2 | 2/2009 | Tarnowski et al. |
| 7,670,724 B1 | 3/2010 | Chan et al. |
| 7,848,715 B2 | 12/2010 | Boos |
| 7,858,223 B2 | 12/2010 | Visco et al. |
| 7,993,773 B2 | 8/2011 | Snyder et al. |
| 8,010,048 B2 | 8/2011 | Brommer et al. |
| 8,021,778 B2 | 9/2011 | Snyder et al. |
| 8,056,814 B2 | 11/2011 | Martin et al. |
| 8,236,443 B2 | 8/2012 | Snyder et al. |
| 8,518,581 B2 | 8/2013 | Neudecker et al. |
| 9,029,012 B2 | 5/2015 | Neudecker et al. |
| 2001/0005561 A1 | 6/2001 | Yamada et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0033330 A1 | 3/2002 | Demaray et al. |
| 2002/0037756 A1 | 3/2002 | Jacobs et al. |
| 2002/0066539 A1 | 6/2002 | Muller |
| 2002/0067615 A1 | 6/2002 | Muller |
| 2002/0071989 A1 | 6/2002 | Verma et al. |
| 2002/0076133 A1 | 6/2002 | Li et al. |
| 2002/0090758 A1 | 7/2002 | Henley et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0110733 A1 | 8/2002 | Johnson |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0030589 A1 | 2/2003 | Zurcher et al. |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0057423 A1 | 3/2003 | Shimoda et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0076642 A1 | 4/2003 | Shiner et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0146877 A1 | 8/2003 | Mueller |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. ............... 429/217 |
| 2003/0185266 A1 | 10/2003 | Henrichs |
| 2003/0231106 A1 | 12/2003 | Shafer |
| 2003/0232248 A1 | 12/2003 | Iwamoto et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043288 A1 | 3/2004 | Nishijima et al. |
| 2004/0043557 A1 | 3/2004 | Haukka et al. |
| 2004/0048157 A1 | 3/2004 | Neudecker et al. |
| 2004/0053124 A1 | 3/2004 | LaFollette et al. |
| 2004/0058237 A1 | 3/2004 | Higuchi et al. |
| 2004/0072067 A1 | 4/2004 | Minami et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106045 A1 | 6/2004 | Ugaji |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0209159 A1 | 10/2004 | Lee et al. |
| 2004/0212276 A1 | 10/2004 | Brantner et al. |
| 2004/0214079 A1 | 10/2004 | Simburger et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |

(56) References Cited

U.S. PATENT DOCUMENTS

| | | |
|---|---|---|
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0170736 A1 | 8/2005 | Cok |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0186469 A1 | 8/2005 | De Jonghe et al. |
| 2005/0189139 A1 | 9/2005 | Stole |
| 2005/0208371 A1 | 9/2005 | Kim et al. |
| 2005/0221066 A1 | 10/2005 | Brist et al. ............... 428/209 |
| 2005/0239917 A1 | 10/2005 | Nelson et al. |
| 2005/0255828 A1 | 11/2005 | Fisher |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0021261 A1 | 2/2006 | Face |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1 | 3/2006 | Jenson et al. |
| 2006/0071592 A1 | 4/2006 | Narasimhan et al. |
| 2006/0134522 A1 | 6/2006 | Zhang et al. ............ 429/231.3 |
| 2006/0155545 A1 | 7/2006 | Janye |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0021156 A1 | 1/2007 | Hoong et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0064396 A1 | 3/2007 | Oman ........................ 361/700 |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0222681 A1 | 9/2007 | Greene et al. |
| 2007/0224951 A1 | 9/2007 | Gilb et al. |
| 2007/0229228 A1 | 10/2007 | Yamazaki et al. |
| 2007/0235320 A1 | 10/2007 | White et al. |
| 2007/0264564 A1 | 11/2007 | Johnson et al. |
| 2007/0278653 A1 | 12/2007 | Brunnbauer et al. |
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0150829 A1 | 6/2008 | Lin et al. |
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0263855 A1 | 10/2008 | Li et al. |
| 2008/0286651 A1 | 11/2008 | Neudecker et al. |
| 2009/0092903 A1 | 4/2009 | Johnson et al. |
| 2009/0124201 A1 | 5/2009 | Meskens |
| 2009/0181303 A1 | 7/2009 | Neudecker et al. |
| 2009/0302226 A1 | 12/2009 | Schieber et al. |
| 2009/0308936 A1 | 12/2009 | Nitzan et al. |
| 2009/0312069 A1 | 12/2009 | Peng et al. |
| 2010/0001079 A1 | 1/2010 | Martin et al. |
| 2010/0032001 A1 | 2/2010 | Brantner |
| 2010/0086853 A1 | 4/2010 | Venkatachalam et al. |
| 2011/0267235 A1 | 11/2011 | Brommer et al. |
| 2011/0304430 A1 | 12/2011 | Brommer et al. |

FOREIGN PATENT DOCUMENTS

| | | |
|---|---|---|
| DE | 19824145 | 12/1999 |
| DE | 10 2005 014 427 A1 | 9/2006 |
| DE | 10 2006 054 309 A1 | 11/2006 |
| DE | 10 2008 016 665 A1 | 10/2008 |
| DE | 102007030604 | 1/2009 |
| EP | 0 510 883 | 10/1992 |
| EP | 0 639 655 | 2/1995 |
| EP | 0 652 308 | 5/1995 |
| EP | 0 820 088 | 1/1998 |
| EP | 1 068 899 | 1/2001 |
| EP | 0 867 985 | 2/2001 |
| EP | 1 092 689 | 4/2001 |
| EP | 1 189 080 | 3/2002 |
| EP | 1 713 024 A1 | 10/2006 |
| FR | 2806198 | 9/2001 |
| FR | 2 861 218 | 4/2005 |
| JP | 55009305 | 1/1980 |
| JP | 56-076060 | 6/1981 |
| JP | 56156675 | 12/1981 |
| JP | 60058558 | 4/1985 |
| JP | 61-269072 | 11/1986 |
| JP | 62267944 | 11/1987 |
| JP | 63-290922 | 11/1988 |
| JP | 2000-162234 | 11/1988 |
| JP | 2-054764 | 2/1990 |
| JP | 2230662 | 9/1990 |
| JP | 03-036962 | 2/1991 |
| JP | 4058456 | 2/1992 |
| JP | 4072049 | 3/1992 |
| JP | 6-010127 | 1/1994 |
| JP | 6-100333 | 4/1994 |
| JP | 7-233469 | 5/1995 |
| JP | 7-224379 | 8/1995 |
| JP | 08-114408 | 5/1996 |
| JP | 09-259932 A | 10/1997 |
| JP | 10-026571 | 1/1998 |
| JP | 10-239187 | 9/1998 |
| JP | 11204088 | 7/1999 |
| JP | 11-251518 A | 9/1999 |
| JP | 2000144435 | 5/2000 |
| JP | 2000188099 | 7/2000 |
| JP | 2000268867 | 9/2000 |
| JP | 2001-171812 | 6/2001 |
| JP | 2001259494 | 9/2001 |
| JP | 2001297764 | 10/2001 |
| JP | 2001308537 | 11/2001 |
| JP | 2001328198 | 11/2001 |
| JP | 2002-140776 | 5/2002 |
| JP | 2002-344115 | 11/2002 |
| JP | 2003-17040 | 1/2003 |
| JP | 2003-133420 A | 5/2003 |
| JP | 2003347045 | 12/2003 |
| JP | 2004071305 | 3/2004 |

(56) References Cited

FOREIGN PATENT DOCUMENTS

| | | |
|---|---|---|
| JP | 2004 146297 A | 5/2004 |
| JP | 2004149849 | 5/2004 |
| JP | 2004-158268 | 6/2004 |
| JP | 2004273436 | 9/2004 |
| JP | 2005-256101 | 9/2005 |
| JP | 2005-286011 A | 10/2005 |
| JP | 2002-026412 | 2/2007 |
| JP | 7-107752 | 4/2007 |
| KR | 20020007881 | 1/2002 |
| KR | 20020017790 | 3/2002 |
| KR | 20020029813 | 4/2002 |
| KR | 20020038917 | 5/2002 |
| KR | 20030033913 | 5/2003 |
| KR | 20030042288 | 5/2003 |
| KR | 20030085252 | 11/2003 |
| RU | 2241281 | 11/2004 |
| WO | WO 9513629 | 5/1995 |
| WO | WO 9623085 | 8/1996 |
| WO | WO 9623217 | 8/1996 |
| WO | WO 9727344 | 7/1997 |
| WO | WO 9735044 | 9/1997 |
| WO | WO 9847196 | 10/1998 |
| WO | WO 9943034 | 8/1999 |
| WO | WO 9957770 | 11/1999 |
| WO | WO 0021898 | 4/2000 |
| WO | WO 0022742 | 4/2000 |
| WO | WO 0028607 | 5/2000 |
| WO | WO 0036665 | 6/2000 |
| WO | WO 0060682 | 10/2000 |
| WO | WO 0060689 | 10/2000 |
| WO | WO 0062365 | 10/2000 |
| WO | WO 0101507 | 1/2001 |
| WO | WO 0117052 A2 | 3/2001 |
| WO | WO 0124303 | 4/2001 |
| WO | WO 0133651 A1 | 5/2001 |
| WO | WO 0139305 A1 | 5/2001 |
| WO | WO 0173864 A2 | 10/2001 |
| WO | WO 0173865 A2 | 10/2001 |
| WO | WO 0173866 A2 | 10/2001 |
| WO | WO 0173868 A2 | 10/2001 |
| WO | WO 0173870 A2 | 10/2001 |
| WO | WO 0173883 A2 | 10/2001 |
| WO | WO 0173957 A2 | 10/2001 |
| WO | WO 0182390 | 11/2001 |
| WO | 02 15301 A2 | 2/2002 |
| WO | WO 0212932 | 2/2002 |
| WO | WO 0242516 | 5/2002 |
| WO | WO 0247187 A1 | 6/2002 |
| WO | WO 02071506 | 9/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 | 3/2004 |
| WO | WO 2004061887 | 7/2004 |
| WO | WO 2004077519 | 9/2004 |
| WO | 2004093223 A2 | 10/2004 |
| WO | WO 2004086550 | 10/2004 |
| WO | WO 2004093223 | 10/2004 |
| WO | WO-2004093223 A2 | 10/2004 |
| WO | WO 2004106581 | 12/2004 |
| WO | WO 2004106582 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO-2005067645 A2 | 7/2005 |
| WO | WO 2005085138 | 9/2005 |
| WO | WO 2005091405 | 9/2005 |
| WO | WO 2006063308 | 6/2006 |
| WO | WO 2006085307 | 8/2006 |
| WO | WO 2007016781 | 2/2007 |
| WO | WO 2007019853 | 2/2007 |
| WO | WO 2007027535 | 3/2007 |
| WO | WO 2007095604 A2 | 8/2007 |
| WO | WO 2008036731 A2 | 3/2008 |

OTHER PUBLICATIONS

Adachi et al., Thermal and Electrical Properties of Zirconium Nitride, 2005, Journal of Alloys and Compounds, 399, pp. 242-244.
Pichon et al., Zirconium Nitrides Deposited by Dual Ion Beam Sputtering: Physical Properties and Growth Modeling, 1999, Applied Surface Science, 150, pp. 115-124.
Amatucci, G. et al., "Lithium scandium phosphate-based electrolytes for solid state lithium rechargeable microbatteries." 60 Solid State Ionics 357-65 (1993).
Stamer, "Human-powered wearable computing" 35 (3 & 4) IBM Sys. J. 618-29 (1996).
Tarniowy et al., The effect of thermal treatment on the structure, optical and electrical properties of amorphous titanium nitride thin films, Thin Solid Films. vol. 311, (1997), pp. 93-100.
Celgard products description. retrieved from http://celgard.com/pdf/library/Celgard_Product_Comparison_10002.pdf on Jun. 17, 2011.
Jones and Akridge, "A thin film solid state microbattery," Solid State Ionics 53-56 (1992). pp. 628-634.
Inaguma, Yoshiyuki, "High Ionic Conductivity in Lithium Lanthanum Titanate," Solid State Communications, vol. 86, No. 10, pp. 689-693 (1993).
Guy, D., "Novel Architecture of Composite Electrode for Optimization of Lithium Battery Performance," Journal of Power Sources 157, pp. 438-442 (2006).
Wolfenstine, J., "Electrical Conductivity and Charge Compensation in Ta Doped $Li_4Ti_5O_{12}$," Journal of Power Sources 180, pp. 582-585 (2008).
Balanis, Constantine A., "Antenna Theory: Analysis and Design," 3rd Ed., pp. 811-820 (2005).
Hill, R. et al., "Large Area Deposition by Mid-Frequency AC Sputtering," Society of Vacuum Coaters, 41st Annual Tech. Conference Proceedings, 197-202 (1998).
Mamik, Karol et al. "Ionized Sputter Deposition Using an Extremely High Plasma Density Pulsed Magnetron Discharge," J. Vac. Sci. Technol. A 18(4):1533-37 (2000).
Balanis, Constantine A., "Antenna Theory: Analysis and Design," 3rd Ed., pp. 817-820 (John Wiley & Sons, Inc. Publication, 2005).
Dobkin, D.M., "Silicon Dioxide: Properties and Applications".
Hwang et al., "Characterization of Sputter-Deposited $LiMn_2O_4$ Thin Films for Rechargeable Microbatteries," 141(12) J. Electrochem. Soc. 3296-99 (1994).
Jones et al., 53-56 Solid State Ionics 628 (1992).
Mattox "Handbook of Physical Vapor Deposition (PVD) Processing, Society of Vacuum Coaters," Albuquerque, New Mexico 660f and 692ff, Noyes Publications (1998).
Sarro, P., "Silicon Carbide as a New MEMS Technology," Sensors and Actuators 82, 210-218 (2000).
Abraham, K.M. et al., "Inorganic-organic composite solid polymer electrolytes," 147(4) J. Electrochem. Soc. 1251-56 (2000).
Abrahams, I., "$Li_6Zr_2O_7$, a new anion vacancy ccp based structure, determined by ab initio powder diffraction methods," 104 J. Solid State Chem. 397-403 (1993).
Amatucci, G. et al., "Lithium scandium phosphate-based electrolytes for solid state lithium rechargeable microbatteries," 60 Solid State Ionics 357-65 (1993).
Appetecchi, G.B. et al., "Composite polymer electrolytes with improved lithium metal electrode interfacial properties," 145(12) J. Electrochem. Soc. 4126-32 (1998).
Bates, J.B. et al., "Electrical properties of amorphous lithium electrolyte thin films," 53-56 Solid State Ionics 647-54 (1992).
Delmas, C. et al., "Des conducteurs ioniques pseudo-bidimensionnels $Li_8MO_6$ (M=Zr, Sn), $Li_7LO_6$ (L=Nb, Ta) et $Li_6In_2O_6$," 14 Mat. Res. Bull. 619-25 (1979).

(56) References Cited

OTHER PUBLICATIONS

Hu, Y-W. et al., "Ionic Conductivity of lithium phosphate-doped lithium orthosilicate," 11 Mat. Res. Bull. 1227-30 (1976).

Neudecker, B. et al., "Li$_9$SiAlO$_8$: a lithium ion electrolyte for voltages above 5.4 V," 143(7) J. Electrochem. Soc. 2198-203 (1996).

Ohno, H. et al., "Electrical conductivity of a sintered pellet of octalithium zarconate," 132 J. Nucl. Mat. 222-30 (1985).

Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).

Yu, X. et al., "A stable thin-film lithium electrolyte: lithium phosphorus oxynitride," 144(2) J. Electrochem. Soc. 524-532 (1997).

Affinito, J.D. et al., "PML/oxide/PML barrier layer performance differences arising from use of UV or electron beam polymerization of the PML layers," Thin Solid Films 308-309: 19-25 (1997).

Affinito, J.D. et al., "Polymer-oxide transparent barrier layers," Society of Vacuum Coaters, 39$^{th}$ Ann. Technical Conference Proceedings, May 5-10, 1996, Philadelphia, PA, pp. 392-397 (1996).

Alder, T. et al., "High-efficiency fiber-to-chip coupling using low-loss tapered single-mode fiber," IEEE Photonics Tech. Lett. 12(8): 1016-1018 (2000).

Almeida, V.R. et al., "Nanotaper for compact mode conversion," Optics Letters 28(15): 1302-13204 (2003).

Anh et al., "Significant Suppression of Leakage Current in (Ba,Sr)TiO$_3$ Thin Films by Ni or Mn Doping," J. Appl. Phys. ,92(5):2651-2654 (Sep. 2002).

Asghari, M. and Dawnay, E., "ASOC™—a manufacturing integrated optics technology," SPIE 3620: 252-262 (Jan. 1999).

Barbier, D. et al., "Amplifying four-wavelength combiner, based on erbium/ytterbium-doped waveguide amplifiers and integrated splitters," IEEE Photonics Tech. Lett. 9:315-317 (1997).

Barbier, D., "Performances and potential applications of erbium doped planar waveguide amplifiers and lasers," Proc. OAA, Victoria, BC, Canada, pp. 58-63 (Jul. 21-23, 1997).

Beach R.J., "Theory and optimization of lens ducts," Applied Optics 35(12): 2005-2015 (1996).

Belkind, A. et al., "Pulsed-DC Reactive Sputtering of Dielectrics: Pulsing Parameter Effects," 43$^{rd}$ Annual Technical Conference Proceedings (2000).

Belkind, A. et al., "Using pulsed direct current power for reactive sputtering of Al$_2$O$_3$," J. Vac. Sci. Technol, A 17(4): 1934-1940 (1999).

Bestwick, T., "ASOC™ silicon integrated optics technology," SPIE 3631: 182-190 (1999).

Borsella, E. et al., "Structural incorporation of silver in soda-lime glass by the ion-exchange process: a photoluminescence spectroscopy study," Applied Physics A 71: 125-132 (2000).

Byer, R.L., "Nonlinear optics and solid-state lasers: 2000," IEEE J. Selected Topics in Quantum Electronics 6(6): 911-930 (2000).

Campbell, S.A. et al., "Titanium dioxide (TiO2)-based gate insulators," IBM J. Res. Develop. 43(3): 383-392 (1999).

Chang, C.Y. and Sze, S.M. (eds.), in ULSI Technology, The McGraw-Hill Companies, Inc., Nyew York, Chapter 4, pp. 169-170 and 226-231 (1996).

Chen, G. et al., "Development of supported bifunctional electrocatalysts for unitized regenerative fuel cells," J. Electrochemical Society 149(8): A1092-A1099 (2002).

Choi, Y.B. et al., "Er-Al-codoped silicate planar light waveguide-type amplifier fabricated by radio-frequency sputtering," Optics Letters 25(4): 263-265 (2000).

Choy et al., "Eu-Doped Y2O3 Phosphor Films Produced by Electrostatic-Assisted Chemical Vapor Deposition," J. Mater. Res. 14(7): 3111-3114 (Jul. 1999).

Cocorullo, G. et al., "Amorphous silicon waveguides and light modulators for integrated photonics realized by low-temperature plasma-enhanced chemical-vapor deposition," Optics Lett. 21(24): 2002-2004 (1996).

Cooksey, K. et al., "Predicting permeability & Transmission rate for multilayer materials," Food Technology 53(9): 60-63 (1999).

Crowder, M.A. et al., "Low-temperature single-crystal Si TFT's fabricated on Si films processed via sequential lateral solidification," IEEE Electron Device Lett. 19(8): 306-308 (1998).

Delavaux, J-M. et al., "Integrated optics erbium ytterbium amplifier system in 10Gb/s fiber transmission experiment," 22$^{nd}$ European Conference on Optical Communication, Osla, I.123-I.126 (1996).

Distributed Energy Resources: Fuel Cells, Projects, 4 pages http://www.eere.energy.gov/der/fuel_cells/projects.html (2003).

Dorey, R.A., "Low temperature micromoulding of functional ceramic devices," Grant summary for GR/S84156/01 for the UK Engineering and Physical Sciences Research Council, 2 pages (2004).

DuPont Teijin Films, Mylar 200 SBL 300, Product Information, 4 pages (2000).

Electrometals Technologies Limited, Financial Report for 2002, Corporate Directory, Chairman's review, Review of Operations, 10 pages (2002).

E-Tek website: FAQ, Inside E-Tek, E-TEk News, Products; http://www.etek-inc.com/, 10 pages (2003).

Flytzanis, C. et al., "Nonlinear optics in composite materials," in Progress in Optics XXIX, Elsevier Science Publishers B.V., pp. 323-425 (1991).

Frazao, O. et al., "EDFA gain flattening using long-period fibre gratings based on the electric arc technique," Proc. London Comm. Symp. 2001, London, England, 3 pages (2001).

Fujii, M. et al., "1.54 µm photoluminesecne of Er$^{3+}$ doped into SiO$_2$ films containing Si nanocrystals: evidence for energy transfer from Si nanocrystals for Er$^{3+}$," Appl. Phys. Lett. 71(9): 1198-1200 (1997).

Garcia, C. et al., "Size dependence of lifetime and absorption cross section of Si nanocrystals embedded in SiO$_2$," Appl. Phys. Lett. 82(10): 1595-1597 (2003).

Goossens, A. et al., "Sensitization of TiO$_2$ with p-type semiconductor polymers," Chem. Phys. Lett. 287: 148(1998).

Greene, J.E. et al., "Morphological and electrical properties of rf sputtered Y$_2$O$_3$-doped ZrO$_2$ thin films," J. Vac. Sci. Tech. 13(1): 72-75 (1976).

Han, H.-S. et al., "Optical gain at 1.54 µm in Erbium-doped Silicon nanocluster sensitized waveguide," Appl. Phys. Lett. 79(27): 4568-4570 (2001).

Hayakawa, T. et al., "Enhanced fluorescence from Eu$^{3+}$ owing to surface plasma oscillation of silver particles in glass," J. Non-Crystalline Solids 259: 16-22 (1999).

Hayakawa, T. et al., "Field enhancement effect of small Ag particles on the fluorescence from Eu$^{3+}$-doped SiO$_2$ glass," Appl. Phys. Lett. 74(11): 1513-1515 (1999).

Hayfield, P.C.S., I Developmemt of a New Material-Monolithic Ti$_4$O$_7$ Ebonix® Ceramic, Royal Society of Chemistry, Cambridge, Table of Contens, 4 pages (2002).

Hehlen, M.P. et al., "Spectroscopic properties of Er$^{3+}$-and Yb$^{3+}$-doped soda-lime silicate and aluminosilicate glasses," Physical Review B 56(15): 9302-9318 (1997).

Hehlen, M.P. et al., "Uniform upconversion in high-concentration Er$^{3+}$-doped soda lime silicate and aluminosilicate glasses," Optics Letters 22(11); 772-774 (1997).

Horst, F. et al., "Compact, tunable optical devices in silicon-oxynitride waveguide technology," Top. Meeting Integrated Photonics Res. '00, Quebec, Canada, p. IThF1, 3 pages (2000).

Howson, R.P., "The reactive sputtering of oxides and nitrides," Pure & Appl. Chem. 66(6): 1311-1318 (1994).

Hubner, J. and Guldberg-Kjaer, S., "Planar Er- and Yb-doped amplifiers and lasers," COM Technical Univerity of Denmark, 10$^{th}$ European Conf. on Integrated Optics, Session WeB2, pp. 71-74 (2001).

Hwang et al., "Characterization of sputter-deposited LiMn2O4 thin films for rechargeable microbatteries," 141(12) J. Electrochem. Soc. 3296-99 (1994).

Hwang, M-S. et al., "The effect of pulsed magnetron sputtering on the properties of iridium tin oxide thin films," Surface and Coatings Tech. 171: 29-33 (2003).

(56) References Cited

OTHER PUBLICATIONS

Im, J.S. and Sposili, R.S., "Crystalline Si films for integrated active-matrix liquid crystal displays," MRS Bulletin, pp. 39-48 (1996).
Im, J.S. et al., "Controlled super-lateral growth of Si-films for microstructural manipulation and optimization," Physica Status Solidi (A) 166(2): 603-617 (1998).
Im, J.S. et al., "Single-crystal Si films for thin-film transistor devices," Appl. Physics Lett. 70(25): 3434-3436 (1997).
Itoh, M. et al., "Large reduction of singlemode-fibre coupling loss in 1.5% Δ planar lightwave circuits using spot-size converters," Electronics Letters 38(2): 72-74 (2002).
Jackson, M.K. and Movassaghi, M., "An accurate compact EFA model," Eur. Conf. Optical Comm., Munich, Germany, 2 pages (2000).
Janssen, R. et al., "Photoinduced electron transfer from conjugated polymers onto nanocrystalline $TiO_2$," Synthet. Metal, 1 page (1999).
Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).
Jonsson, L.B. et al., "Frequency response in pulsed DC reactive sputtering processes," Thin Solid Films 365: 43-48 (2000).
Kato, K. and Inoue, Y., "Recent progress on PLC hybrid integration," SPIE 3631: 28-36 (1999).
Kato, K. and Tohmori, Y., "PLC hybrid integration technology and its application to photonic components," IEEE J. Selected Topics in Quantum Electronics 6(1): 4-13 (2000).
Kelly, P.J. and Arnell, R.D., "Control of the structure and properties of aluminum oxide coatings deposited by pulsed magnetron sputtering," J. Vac. Sci. Technol. A 17(3): 945-953 (1999).
Kelly, P.J. et al., "A novel technique for the deposition of aluminum-doped zinc oxide films," Thin Solid Films 426(1-2): 111-116 (2003).
Kelly, P.J. et al., "Reactive pulsed magnetron sputtering process for alumina films," J. Vac. Sci. Technol. A 18(6): 2890-2896 (2000).
Kik, P.G. and Polman, A., "Gain limiting processes in Er-doped Si nanocrystal waveguides in $SiO_2$," J. Appl. Phys. 91(2): 536-536 (2002).
Kim et al., "Correlation Between the Microstructures and the Cycling Performance of $RuO_2$ Electrodes for Thin-Film Microsupercapacitros," J. Vac. Sci. Technol. B20(5): 1827-1832 (Sep. 2002).
Kim, D-W. et al. "Mixture Behavior and Microwave Dielectric Properties in the Low-fired $TiO_2$-CuO System," Jpn. J. Appl. Phys. 39:2696-2700 (2000).
Kim, H-K. et al., "Characteristics of rapid-thermal-annealed LiCoO2 cathode film for an all-solid-sate thin film microbattery," J. Vac. Sci. Technol. A 22(4): 1182-1187 (2004).
Kim, J-Y. et al. "Frequency-dependent pulsed direct current magnetron sputtering of titanium oxide films," J. Vac. Sci. Technol. A 19(2):429-434 (2001).
Ladouceur, F. and Love, J.D., in: Silica-based Buried Channel Waveguides and Devices, Chapman & Hall, London, Table of Contents, 6 pages (1996).
Ladouceur, F. et al., "Effect of side wall roughness in buried channel waveguides," IEEE Proc. Optoelectron. 141(4):242-248 (1994).
Lamb, W. and Zeiler, R., Designing Non-Foil Containing Skins for Vacuum Insulation Panel (VIP) Application, Vuoto XXVIII(1-2):55-58 (1999).
Lamb, W.B., "Designing Nonfoil Containing Skins for VIP Applications," DuPont VIA Symposium Presentation, 35 Pages (1999).
Lange, M.R. et al, "High Gain Ultra-Short Length Phosphate glass Erbium-Doped Fiber Amplifier Material," OSA Optical Fiber Communications (OFC), 3 Pages (2002).
Laporta, P. et al, "Diode-pumped cw bulk Er: Yb: glass laser," Optics Letters 16(24):1952-1954 (1991).
Laurent-Lund, C. et al., "PECVD Grown Multiple Core Planar Waveguides with Extremely Low Interface Reflections and Losses," IEEE Photonics Tech. Lett. 10(10):1431-1433 (1998).

Lee, B.H. et al., "Effects of interfacial layer growth on the electrical characteristics of thin titanium oxide films on silion," Appl. Phys. Lett. 74(21):3143-3145 (1999).
Lee, K.K. et al., "Effect of size and roughness on light transmission in a $Si/SiO_2$ waveguide: Experiments and model," Appl. Phys. Lett. 77(11):1617-1619 (2000).
Love, J.D. et al., "Quantifying Loss Minimisation in Single-Mode Fibre Tapers," Electronics Letters 22(17):912-914 (1986).
Mardare, D. and Rusu, G.I., "On the structure of Titanium Oxide Thin Films," Andalele Stiintifice Ale Universitatti IASI, Romania, pp. 201-208 (1999).
Marques, P.V.S. et al., "Planar Silica-on-Silicon Waveguide Lasers Based in Two Layers Core Devices," $10^{th}$ European Conference on Integrated Optics, Session WeB2, pp. 79-82 (2001).
Meijerink, A. et al, "Luminescence of $Ag^+$ in Crystalline and Glassy $Srb_4O_7$," J. Physics Chem. Solids 54(8):901-906 (1993).
Mesnaoui, M. et al, "Spectroscopic properties of $Ag^+$ ions in phosphate glasses of $NaPO_3$—$AgPO_3$ system," Eur. J. Solid State Inorg. Chem. 29:1001-1013 (1992).
Mitomi, O. et al., "Design of a Single-Mode Tapered Waveguide for Low-Loss Chip-to-Fiber Coupling," IEEE J. Quantum Electronics 30(8): 1787-1793 (1994).
Mizuno, Y. et al "Temperature dependence of oxide decomposition on titanium surfaces in UHV," J. Vac. Sci & Tech. A. 20(5): 1716-1721 (2002).
Ohkubo, H. et al., Polarization-Insensitive Arrayed-Waveguide Grating Using Pure $SiO_2$ Cladding, Fifth Optoelectronics and Communication Conference (OECC 2000) Technical Digest, pp. 366-367 (2000).
Ohmi, S. et al., "Rare earth mental oxides for high-K fate insulator," VLSI Design 2004, 1 Page (2004).
Ohtsuki, T., et al., "Gain Characteristics of high concentration $Er^{3+}$-doped phosphate glass waveguide," J. Appl. Phys. 78(6):3617-3621 (1995).
Ono, H. et al., "Design of a Low-loss Y-branch Optical Waveguide," Fifth Optoelectronic and Communications Conference (OECC 2000) Technical Digest, pp. 502-503 (2000).
Padmini, P. et al. "Realization of High Tunability Barium Strontium Titanate Thin Films by rf Megnetron Sputtering," Appl. Phys. Lett. 75(20):3186-3188 (1999).
Pan, T. et al., "Planar $Er^{3+}$-doped aluminosilicate waveguide amplifier with more than 10 dB gain across C-band," Optical Society of America, 3 pages (2000).
Park et al., "Characteristics of Pt Thin Film on the Conducting Ceramics TiO and Ebonex ($Ti_4O_7$) as Electrode Materials," Thin Solid Films 258: 5-9 (1995).
Peters, D.P. et al., "Formation mechanism of silver nanocrystals made by ion irradiation of $Na^+$—$Ag^+$ ion-exchanged sodalime silicate glass," Nuclear Instruments and Methods in Physics Research B 168:237-244 (2000).
Rajarajan, M. et al., "Numerical Study of Spot-Size Expanders fro an Efficient OEIC to SMF Coupling," IEEE Photonics Technology Letters 10(8): 1082-1084 (1998).
Ramaswamy, R.V. et al., "Ion-Exchange Glass Waveguides: A Review," J. Lightwave Technology 6(6); 984-1002 (1988).
Roberts, S.W. et al., "The Photoluminescence of Erbium-doped Silicon Monoxide," University of Southampton , Department of Electronics and Computer Science Research Journal, 7 pages (1996).
Saha et al., "Large Reduction of Leakage Current by Graced-Layer La Doping in $(Ba0.5,Sr0.5)TiO3$ Thin Films," Appl. Phys. Lett. 79(1): 111-113 (Jul. 2001).
Sanyo Vacuum Industries Co., Ltd. Products Infor, $TiO_2$, (2003, 1 page, http://www.sanyovac.co.jp/Englishweb/products?EtiO2.htm.
Schermer, R. et al., "Investigation of Mesa Dielectric Waveguides," Proceedings of the OSA Integrated Photonics Research Topical Meeting and Exhibit, Paper No. IWB3, 3 pages (2001).
Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).

(56) References Cited

OTHER PUBLICATIONS

Scholl, R., "Power Supplies for Pulsed Plasma Technologies: State-of-the-Art and Outlook," Advances Energy Industries, Inc. 1-8 (1999).
Scholl, R., "Power Systems for Reactive Sputtering of Insulating Films," Advances Energy Industries, Inc., 1-8 (Aug. 2001).
Second International Symposium of Polymer Surface Modification: Relevance to Adhesion, Preliminary Program, 13 pages (1999).
Seventh International Conference on $TiO_2$ Photocatalysis: Fundamentals & Applications, Toronto, Ontario, Canada, Final Program, 7 pages (Nov. 17-21, 2002).
Sewell, P. et al., "Rib Waveguide Spot-Size Tranformers: Modal Properties," J Lightwave Technology 17(5):848-856 (1999).
Shaw, D.G. et al., "Use of Vapor Deposited Acrylate Coatings to Improve the Barrier Properties of Metallized Film," Society of Vacuum Coaters, 37$^{th}$ Annual Technical Conference Proceedings, pp. 240-244 (1994).
Shin, J.C. et al. "Dielectric and Electrical Properties of Sputter Grown (Ba,Se)$TiO_3$ Thin Films," J. Appl. Phys. 86(1):506-513 (1999).
Shmulovich, J. et al., "Recent progress in Erbium-doped waveguide amplifiers." Bell Laboratories, pp. 35-37 (1999).
Slooff, L.H. et al., "Optical properties of Erbium-doped organic polydentate cage complexes," J. Appl. Phys. 83(1):497-503 (1998).
Smith, R.E. et al., "Reduced Coupling Loss Using a Tapered-Rib Adiabatic-Following Fiber Coupler." IEEE Photonics Technology Lett. 8(8):1052-1054 (1996).
Snoeks, E. et al., "Cooperative upconversion in erbium-implanted soda-lime silicate glass optical waveguides," J. Opt. Soc. Am. B 12(8): 1468-1474 (1995).
Strohhofer, C. and Polman, A. "Energy tranfer to $Er^{3+}$ in Ag ion-exchanged glass," FOM Institute for Atomic and Molecular Physics, 10 pages (2001).
Sugiyama, A. et al., "Gas Permeation Through the Pinholes of Plastic Film Laminated with Aluminum Foil," Vuoto XXVIII(1-2):51-54 (1999).
Tervonen, A. "Challenges and opportunities for integrated optics in optical networks," SPIE 3620:2-11 (1999).
Ting, C.Y. et al., "Study of planarized sputter-deposited $SiO_2$," J. Vac. Sci Technol, 15(3):1105-1112 (1978).
Tomaszewski, H. et al., "Yttria-stabilized zirconia thin films grown by reactive r.f. magnetron sputtering," Thin Solid Films 287: 104-109 (1996).
Triechel, O. and Kirchhoff, V., "The influences of pulsed magnetron sputtering on topography and crystallinity of $TiO_2$ films on glass," Surface and Coating Technology 112:268-272 (2000).
Tukamoto, H. and West, A.R., "Electronic Conductivity of $LiCoO_s$ and Its Enhancement by Magnesium Doping," J. Electrochem. Soc 144(9):3164-3168 (1997).
Van Dover, R.B., "Amorphous Lanthanide-Doped $TiO_x$ Dielectric Films," Appl. Phys. Lett. 74(20):3041-3043 (1999).
Viljanen, J. and Leppihalme, M., "Planner Optical Coupling Elements for Multimode Fibers with Two-Step Ion Migration Process," Applied Physics 24(1):61-63 (1981).
Villegas, M.A. et al., "Optical spectroscopy of a soda lime glass exchanged with silver," Phys. Chem. Glasses 37(6):248-253 (1996).
Von Rottkay, K. et al., "Influences of stoichiometry on electrochromic cerium-titanium oxide compounds," Presented at the 11$^{th}$ Int'l Conference of Solid State Ionics, Honolulu, Hawaii, Nov. 19, 1997, Published in Solid State Ionics 113-115:425-430. (1998).
Westlinder, J. et al., "Simulations and Dielectric Characterization of Reactive dc Magnetron Cosputtered $(Ta_2O_5)_{1-x}(TiO_2)_x$ Thin Films," J Vac. Sci. Technol. B 20(3):855-861 (May/Jun. 2002).
Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).
Yanagawa, H. et al., "Index-and-Dimensional Taper and Its Application to Photonic Devices," J. Lightwave Technology 10(5):587-591 (1992).
Yoshikawa, K. et al., "Spray formed aluminum alloys for sputtering targets," Powder Metallurgy 43(3): 198-199 (2000).
Zhang, H. et al., "High Dielectric Strength, High k $TiO_2$ Films by Pulsed DC, Reactive Sputter Deposition," 5 pages (2001).
Bates et al., "Thin-Film Lithium Batteries," in New Trends in Electrochemical Technology: Energy Storage Systems for Electronics (T. Osaka & M. Datta eds. Gordon and Bresch 2000).
Wang et al., "Characterization of Thin-Film Rechargeable Lithium Batteries with Lithium Cobalt Oxide Cathodes," 143 J. Electrochem. Soc. 3203-13 (1996).
European Examination Report (dated Apr. 16, 2015), Application No. EP14164006.0, Date Filed—May 14, 2007, (6 pages).
European Search Report (dated May 15, 2014), Application No. EP14164006.0, Date Filed—May 14, 2007, (11 pages).
Sapurast Research LLC, Notice of preliminary rejection for Korean Application No. 10-2014-7029445, (Jul. 31, 2015).
Sapurast Research LLC, Non final office action for U.S. Appl. No. 14/041,575, (Jul. 10, 2015).
KIPO Preliminary Rejection (dated Dec. 29, 2014), Korean Application No. 10-2014-7029445, Date Filed Oct. 21, 2014, (7 pages).

THIN FILM BATTERY ON AN INTEGRATED CIRCUIT OR CIRCUIT BOARD AND METHOD THEREOF

RELATED APPLICATIONS

This application is a divisional of Ser. No. 11/748,471 filed on May 14, 2007, which claims priority under 35 U.S.C. §119(e) to U.S. provisional patent application Ser. No. 60/799,904, filed on May 12, 2006, which is incorporated herein in its entirety by reference; and is a continuation in part, and claims benefit under 35 U.S.C. §120, of U.S. patent application Ser. No. 11/687,032 filed Mar. 16, 2007, now U.S. Pat. No. 8,236,443 issued Aug. 7, 2012, entitled Metal Film Encapsulation, filed 16 Mar. 2007, which claims benefit under 35 U.S.C. §119 of U.S. provisional patent application Ser. No. 60/782,792, filed 16 Mar. 2006, both of which are incorporated herein in their entirety by reference. U.S. patent application Ser. No. 11/687,032 is also a continuation in part of U.S. patent application Ser. No. 11/561,277 filed Nov. 17, 2006, now U.S. Pat. No. 8,445,130 issued May 21, 2013, which claims the benefit of U.S. provisional patent application Ser. No. 60/782,792 filed Mar. 16, 2006, U.S. provisional patent application Ser. No. 60/759,479 filed Jan. 17, 2006, and U.S. provisional patent application Ser. No. 60/737,613 filed Nov. 17, 2005.

FIELD OF THE INVENTION

The field of this invention is the device, composition, method of depositing and fabrication of flexible solid-state, thin-film, secondary and primary electrochemical devices, including batteries, onto a semiconducting surface, onto a conductive or insulating surface of a semiconductor device, such as integrated circuit chips, or onto a circuit board, such as printed circuit board.

BACKGROUND

Typical electrochemical devices comprise multiple electrically active layers such as an anode, cathode, electrolyte, substrate, current collectors, etc. Some layers, such as, for example, an anode layer comprising lithium, are comprised of materials that are very environmentally sensitive. The substrate may, for example, not be a separate battery element but instead be provided by a semiconducting surface or onto a conductive or insulating packaging surface of a semiconductor device to which the battery is attached. Such batteries require an encapsulation to protect such environmentally sensitive material. Some schemes encapsulate the sensitive layers of electrochemical devices, such as encapsulation with gold foil. Other schemes encapsulate the device with pouch, for example, made of metal and plastic, that seals around the perimeter of the device.

SUMMARY

An exemplary embodiment of the present invention includes a battery fabricated on a semiconductor chip or fabricated on a flexible printed circuit board. The battery may, for example, include a first electrical contact, a bonding layer coupled with the first electrical contact and having a first embedded conductor, at least one battery cell structure in selective electrical contact with said first electrical contact via the first embedded conductor, a semiconducting surface or a conductive or insulating packaging surface of a semiconductor device.

The bonding layer coupled with the semiconducting surface or a conductive or insulating packaging surface of a semiconductor device may have more than one conductor, such an optional, second embedded conductor, which in turn creates an optional, selective electrical contact of the semiconducting surface or a conductive or insulating packaging surface of a semiconductor device with said first electrical contact. In any case, the bonding layer and the at least one battery cell structure may be sandwiched between the first contact layer and the semiconducting surface or the conductive or insulating packaging surface of a semiconductor device.

The first electrical contact may, for example, include an encapsulate metal. The bonding layer may be an adhesive material, an insulating material, a plastic, a polymeric material, glass, and/or fiberglass. An insulative reinforcement layer may be embedded within the bonding layer. Such a reinforcement layer may be selectively conductive. The conductor may be, for example, a tab, a wire, a metal strip, a metal ribbon, multiple wires, multiple metal strips, multiple metal ribbons, a wire mesh, perforated metal, a metal coating applied to the adhesive layer, or a disk. The conductor may be woven within the bonding layer and the bonding layer may include a slit within which the embedded conductor is woven.

The battery cell structure may include an anode, an electrolyte, a cathode, and a barrier layer. The cathode may, for example, not be annealed at all, annealed at lower temperatures, or annealed at higher temperatures, by using convection furnaces, rapid thermal anneal methods, or by a laser annealing and/or crystallization process.

Another exemplary embodiment of the present invention includes a method of manufacturing a thin film battery comprising, in no particular order, the steps of creating a selectively conductive bonding layer, coupling the bonding layer with a first contact layer, coupling a first side of a battery cell structure with a semiconducting surface or a conductive or insulating surface of a semiconductor device or flexible printed circuit board, and coupling a second side of the battery cell structure with the bonding layer. Optionally, the bonding layer may be made selectively conductive at an additional location at which the selectively conductive bonding layer creates an electrical contact between the first contact layer and the semiconducting surface or a conductive or insulating surface of a semiconductor device or flexible printed circuit board. Yet another exemplary embodiment of the present invention includes a method of manufacturing a thin film battery comprising, in no particular order, the steps of creating a selectively conductive bonding layer, coupling the bonding layer with a first contact layer, coupling a first side of a battery cell with the first contact layer as well, coupling the bonding layer with the a semiconducting surface or a conductive or insulating surface of a semiconductor device or flexible printed circuit board, and coupling a second side of the battery cell structure with the bonding layer.

Examples of this embodiment may include creating a battery cell structure with an anode, cathode, and electrolyte layers, embedding at least one conductor within the bonding layer, weaving at least one conductive wire through the bonding layer wherein selective portions of the conductive wire are exposed, heating the bonding layer and compressing the conductor within the bonding layer, and insulating the battery with an insulating material. This exemplary embodiment may include providing an insulative reinforcement layer embedded within the bonding layer. The reinforcement layer may be selectively conductive.

Yet another exemplary embodiment of the present invention involves a battery on a flexible printed circuit board wherein the first side of the battery cell structure is at least in direct mechanical contact with the flexible printed circuit board. The battery includes a first electrical contact, a bonding layer coupled with the first electrical contact and comprising an first embedded conductor, at least one battery cell structure in selective electrical contact with the first electrical contact via the first embedded conductor, the bonding layer coupled with the first electrical contact and comprising a second embedded conductor that is in selective electrical contact with the first electrical contact and the flexible printed circuit board. The bonding layer and the at least one battery cell structure are sandwiched between the first contact layer and a flexible printed circuit board.

Another exemplary embodiment of the present invention involves a battery on a flexible printed circuit board wherein the battery cell structure is not in direct mechanical contact with the flexible printed circuit board but mechanically separated by at least the bonding layer. The battery includes a first electrical contact, a bonding layer coupled with the first electrical contact and comprising a first embedded conductor, at least one battery cell structure in selective electrical contact with the first electrical contact via said first embedded conductor, the bonding layer coupled with the flexible printed circuit board and having an optional, second embedded conductor in the bonding layer, which in turn creates an optional, selective electrical contact of the flexible printed circuit board with said first electrical contact. The bonding layer and the at least one battery cell structure are sandwiched between the first contact layer and a flexible printed circuit board.

In another exemplary embodiment, a method of manufacturing a thin film battery includes creating a selectively conductive bonding layer, coupling the bonding layer with a first contact layer, coupling a first side of a battery cell structure with a flexible printed circuit board; and coupling a second side of the battery cell structure with the bonding layer.

In yet another exemplary embodiment, a method of manufacturing a thin film battery includes creating a selectively conductive bonding layer, coupling the bonding layer with a first contact layer, coupling a first side of a battery cell structure with the first contact layer; and coupling a second side of the battery cell structure with the selectively conductive bonding layer, and coupling the bonding layer with the flexible printed circuit board.

Another exemplary embodiment of the present invention includes the electrical connection between the battery cell and the semiconducting surface or the conductive packaging surface of a semiconductor device. The electrical connection between the battery cell and the semiconducting surface or the conductive packaging surface of a semiconductor device can be made by direct physical contact or by wire bonding.

In another aspect, prior to its integration onto the semiconducting surface or a conductive or insulating packaging surface of a semiconductor device or into or onto a flexible printed circuit board, the battery may be fabricated as a discrete device and then integrated as a whole together with its substrate and its encapsulation.

Another embodiment of the present invention includes the electrical connection between a multi-battery cell stack and the semiconducting surface or the conductive packaging surface of a semiconductor device.

DETAILED DESCRIPTION

Figure 1A:
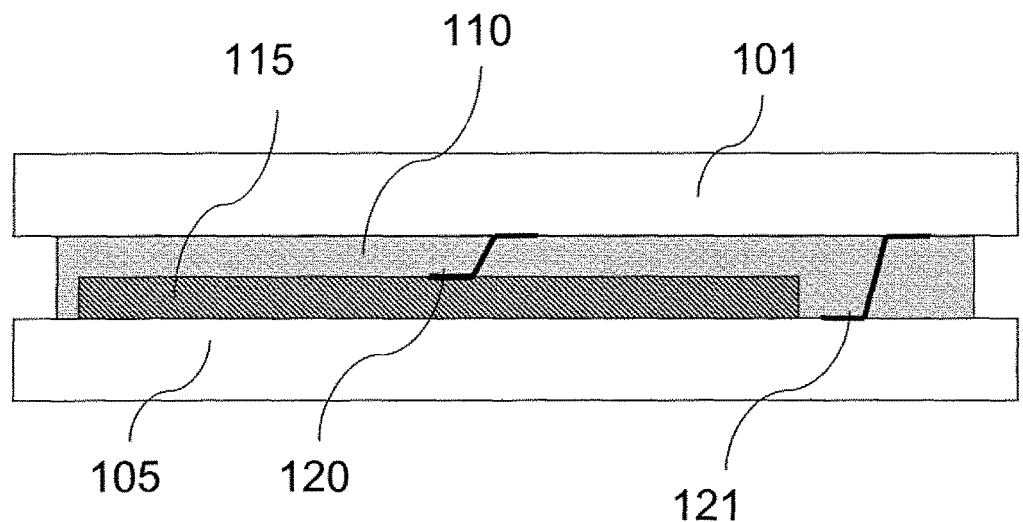
FIG. 1A shows a side view of an example of a thin film battery with a semiconducting surface or the conductive or insulating surface of a semiconductor device or a flexible printed circuit board according to an exemplary embodiment of the present invention.

FIG. 1A shows a side view of an electrochemical device according to one exemplary embodiment of the present invention. In this embodiment, a first contact 101 is coupled with bonding layer 110 with a portion of the first contact 101 extending past the bonding layer 110. The bonding layer 110 may, for example, be bonded with the cell structure 115. A semiconducting surface or the conductive or insulating surface of a semiconductor device 105 is placed under the battery cell structure 115. An insulating surface of the semiconductor device 105 may be, for example, an insulating packaging surface of a semiconductor device or an upper insulating surface the semiconductor device. A conductive surface may include, for example, a conductive contact pad, a conductive line, conductive via or other conductive layer formed on or at the device surface. A conductive surface also may be formed together with an insulating surface, such as a conductive surface formed on a packaging surface of a semiconductor device. Shown embedded within the bonding layer 110 is a first embedded conductor 120. This first embedded conductor 120, for example, creates a selectively conductive bonding layer. A selectively conductive bonding layer 110 permits conduction from the cell structure 115 through the bonding layer 110 to the first contact 101 at specific points, and yet provides insulation between the first contact 101 and the semiconducting surface or the conductive or insulating surface of a semiconductor device 105. Other types of battery cell structures may be also be included.

The electrochemical device may have a second embedded conductor 121 that selectively creates an electrical contact between the first contact 101 and the semiconducting surface or the conductive or insulating packaging surface of a semiconductor device 105. In this case, the semiconducting surface or the conductive or insulating surface of a semiconductor device 105 must be selectively insulating between the contacts points at which the first embedded conductor 120 and the second embedded conductor 121 meet the semiconducting surface or the conductive or insulating (e.g., packaging) surface of a semiconductor device 105.

Figure 1B:
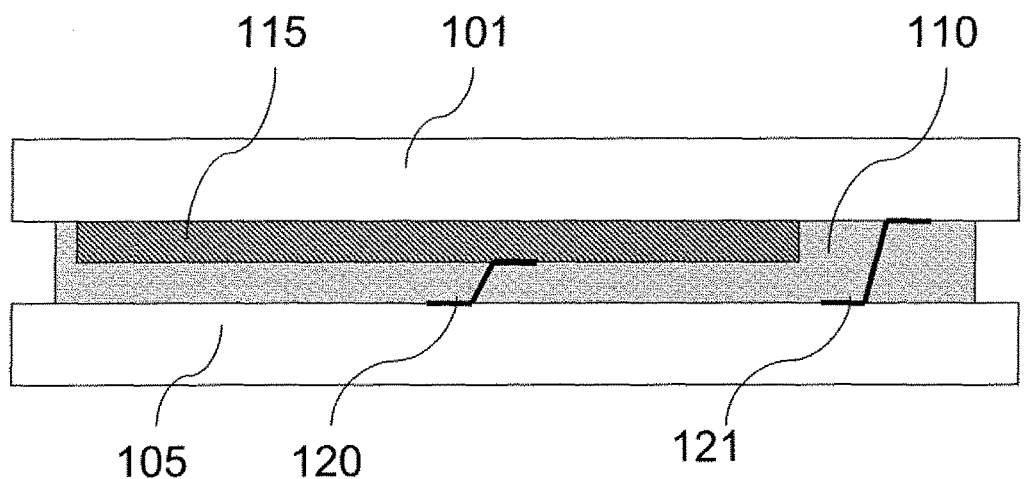
FIG. 1B shows a side view of another example of a thin film battery with a semiconducting surface or the conductive or insulating packaging surface of a semiconductor device or a flexible printed circuit board according to an exemplary embodiment of the present invention.

FIG. 1B shows a side view of an electrochemical device according to an exemplary embodiment of the present invention. In this embodiment, a first contact 101 is coupled with the battery cell structure 115. A bonding layer 110 is coupled to the battery cell structure 115 and a portion of the first contact 101, which extends past the bonding layer 110. A semiconducting surface or the conductive or insulating surface of a semiconductor device 105 is coupled with the bonding layer 110. Shown embedded within the bonding layer 110 is the first embedded conductor 120. This first embedded conductor 120, for example, creates a selectively conductive bonding layer. A selectively conductive bonding layer 110 permits conduction from the cell structure 115 through the bonding layer 110 to the semiconducting surface or the conductive or insulating (e.g., packaging) surface of a semiconductor device 105 at specific points, and yet provides insulation between the first contact 101 and the semiconducting surface or the conductive or insulating surface of a semiconductor device 105. The electrochemical device may have a second embedded conductor 121 that selectively creates an electrical contact between the first contact 101 and the semiconducting surface or the conductive or insulating surface of a semiconductor device 105. In this case the semiconducting surface or the conductive or insulating surface of a semiconductor device 105 must be selectively insulating between the contact points at which the first embedded conductor 120 and the second embedded conductor 121 meet the semiconducting surface or the conductive or insulating packaging surface of a semiconductor device 105. The first embedded conductor 120 and the second embedded conductor 121 may be placed within the bonding layer 110 in many different ways. For example, a metal tab, a metal wire, a metal strip, a metal ribbon, multiple metal wires, multiple metal strips, multiple metal ribbons, a metal wire mesh, perforated metal foil, perforated metal, a metal coating applied to the adhesive layer, a metallic disk, a metallically coated fiberglass or combinations thereof may be used. In each of these examples, the first embedded conductor 120 and the second embedded conductor 121 can provide electrical conduction between the cell structure 115 and the first contact 101 and the bonding layer 110 provides insulation between the first contact 101 and the semiconducting surface or the conductive or insulating surface of a semiconductor device 105. In some embodiments, the embedded conductors 120 and 121 may be woven within the bonding layer 110. The embedded conductors 120 and 121 may be, for example, disks embedded within the bonding layer 110. In some embodiments slits within the bonding layer 110 may be made in order to weave or place the embedded conductors 120 and 121 through the bonding layer 110. Also, for example, holes or other means may be used to place the embedded conductors 120 and 121 through the bonding layer 110.

In another exemplary embodiment of the present invention, a reinforcement layer may be placed within the bonding layer. For example, a fiberglass material may cover half of one surface of the bonding layer, woven through the layer and then cover the other half of the bonding layer. Such a layer of fiberglass without a conductive coating would insulate the materials placed between. The fiberglass may be coated in a localized area with a conductive material. Such conductive coatings can coat the fiberglass area in the top and bottom surface of the bonding layer. In such an embodiment, for example, the fiberglass may conduct between the upper contact and the cell. Conductive material may be disposed on the fiberglass using ink jet, silk screen, plasma deposition, e-beam deposition, spray and/or brush methods. Other materials may be used rather than fiberglass, such as, for example, Kevlar®, plastic, glass or other insulating materials.

Another exemplary embodiment of the present invention may provide for selective contact between the first contact and the battery cell structure through holes in the bonding layer. In such an embodiment, holes in the bonding layer may allow the first contact and battery cell structure to remain in contact. The layers may be, for example, pressed together to create a contact. Alternatively, conductive glues or inks may be applied in or near the hole area in the bonding layer to make the contact between the layers. Lithium may also be used.

The embedded conductors 120 and 121 and/or first contact, for example, may be made of gold, platinum, stainless steel, titanium, vanadium, chromium, manganese, iron, cobalt, nickel, copper zirconium, niobium, molybdenum, hafnium, tantalum, tungsten, aluminum, indium, tin, silver, carbon, bronze, brass, beryllium, or oxides, nitrides, carbides, and alloys thereof. The first contact may be a metal foil, for example, may be made of stainless steel or any other metallic substance having the necessary or suitable characteristics and properties such as a requisite amount of conductivity. The metal foil may preferably comprise a solderable alloy, for instance, alloys of copper, nickel, or tin. The first contact may be, for example, less than 100 microns thick, less than 50 microns thick, or less than 25 microns thick.

The cell structure 115 may include a cathode, anode and electrolyte. For example, the cathode may comprise $LiCoO_2$, the anode may comprise lithium and the electrolyte may comprise LIPON. Other electrochemical devices may be used as needed.

The cell structure 115 may be coupled with the semiconducting surface or the conductive or insulating packaging surface of a semiconductor device 105 in a number of ways. In one embodiment, the electrochemical device, for example, may be coupled with the semiconducting surface or the conducting or insulating surface of a semiconductor device 105 using glue. Glue, as used in this application, extends to any material that may adhere the cell structure 115 to the semiconducting surface or the conducting or insulating surface of a semiconductor device 105. The glue may create either a mechanical or chemical bond between the two layers. Glue may also include chemically bonding the two layers without introducing another material or layer. Glue, for example, may include but is not limited to cement glue and resin glue. The glue may be electrically conducting, semi-conducting, or insulating.

In another exemplary embodiment, the semiconducting surface or the conductive or insulating (e.g., packaging) surface of a semiconductor device 105 acts as a substrate for the battery. The semiconducting surface or the conductive or insulating packaging surface of a semiconductor device 105 is provided and the cell structure 115 may be deposited thereon. The cell structure 115 may also be glued to the semiconducting surface or the conductive or insulating packaging surface of a semiconductor device 105.

In an exemplary embodiment, a $LiCoO_2$ cathode layer is deposited on the semiconducting surface or the conducting or insulating surface of a semiconductor device 105. A number of deposition techniques are known in the art, these include, but are not limited to reactive or non-reactive RF magnetron sputtering, reactive or non-reactive pulsed DC magnetron sputtering, reactive or non-reactive DC diode sputtering, reactive or non-reactive thermal (resistive) evaporation, reactive or non-reactive electron beam evaporation, ion-beam assisted deposition, plasma enhanced chemical vapor deposition, or deposition methods, which may include, for example, spin coating, ink-jetting, thermal spray deposition, dip coating or the like. As part of the fabrication process, for example, the cathode may be annealed using a thermal anneal such as anneal at lower temperatures, anneal at higher temperatures, or by using convection furnaces or rapid thermal anneal methods. Another or an alternative post-deposition anneal may include laser annealing to improve the crystallization of the $LiCoO_2$ layer so as to fine-tune and optimize its chemical properties, such as its electrochemical potential, its energy, its power performance, and its reversible lattice parameters on electrochemical and thermal cycling.

Following deposition of the cathode layer, an electrolyte may be deposited on the cathode, followed by an anode. Again, these layers may be deposited by any of a number of processes common in the art. In one specific embodiment, once the cell structure 115 has been deposited on the semiconducting surface or the conducting or insulating surface of a semiconductor device 105, a bonding layer 110 may be placed between the electrochemical device and a first electrical contact 101. In this specific embodiment shown in FIG. 1A, a metal encapsulate layer 101 may also be the first contact. In another specific embodiment, once the cell structure 115 has been deposited on the first electrical contact 101, a bonding layer 110 may be placed between the cell structure 115 and the semiconducting surface or the conducting or insulating surface of a semiconductor device 105. In this specific embodiment shown in FIG. 1B, a metal encapsulate layer 101 may also be the first contact. As described above, the first contact may be a metal foil, for example, may be made of stainless steel or any other metallic substance having the necessary characteristics and properties such as a requisite amount of conductivity. The metal foil may preferably comprise a solderable alloy, for instance, alloys of copper, nickel, or tin. The first contact may be, for example, less than 100 microns thick, less than 50 microns thick, or less than 25 microns thick.

The bonding layer 110 may include, for example, an adhesive material, an insulating material, polymeric material, glass, Kevlar®, reinforcement materials, and fiberglass. The embedded conductors 120 and 121 may include, for example, a tab, a wire, a metal strip, a metal ribbon, multiple wires, multiple metal strips, multiple metal ribbons, a wire mesh, perforated metal, a metal coating applied to the adhesive layer, and a disk.

Figure 2:
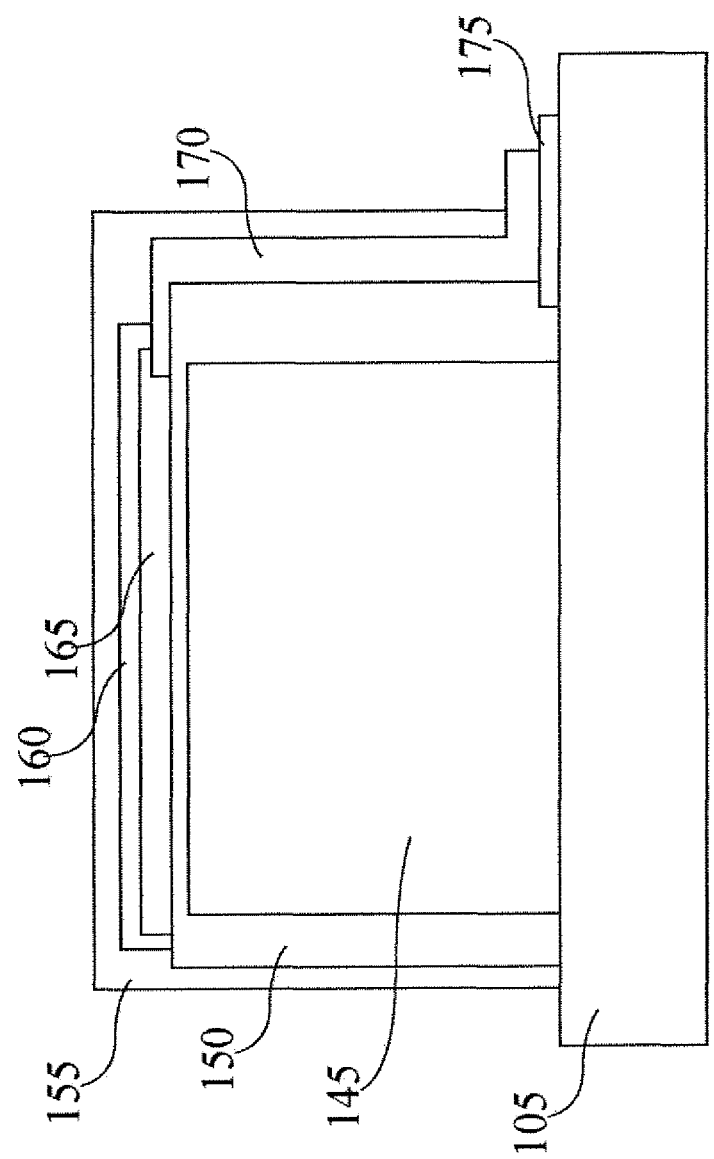
FIG. 2 shows a side view of an example of a thin film battery with a semiconducting surface or the conductive or insulating surface of a semiconductor device according to another exemplary embodiment of the present invention.

FIG. 2 shows a second embodiment of a thin film battery on a chip. In this embodiment the battery may include a semiconducting surface or the conductive or insulating packaging surface of a semiconductor device 105, a cathode layer 145 deposited on the semiconducting surface or the conductive or insulating packaging surface of a semiconductor device 105, an electrolyte 150, an anode 165, a modulating layer 160, an encapsulate 155, an anode current collector 170 and an insulator 175. For example, the cathode 145 may comprise $LiCoO_2$, the anode 165 may comprise lithium and the electrolyte 150 may comprise LIPON. Other electrochemical devices may be used as needed. The encapsulate 155 may comprise a ceramic-metal composite laminate of a multiple of alternating layers of zirconium nitride and zirconium or titanium nitride and titanium.

The electrochemical device which may include the cathode 145, electrolyte 150 and anode 165, may be semiconducting surface or the conductive or insulating packaging surface of a semiconductor device 105 in a number of ways. In one embodiment, the electrochemical device, for example, may be coupled with the substantially conductive, semiconducting surface or the conductive packaging surface of a semiconductor device 105 using glue. Glue, as used in this application, extends to any material that may adhere parts of the electrochemical device to the semiconducting surface or the conductive or insulating packaging surface of a semiconductor device 105. The glue may create either a mechanical or chemical bond between the two layers. Glue may also include chemically bonding the two layers without introducing another material or layer. The glue may be electrically conductive in order to use the semiconducting surface or the conductive or insulating packaging surface of a semiconductor device 105 as current collector. Glue, for example, may include but is not limited to electrically conductive cement glue and resin glue.

The cathode 145 may also be deposited directly on the semiconducting surface or the conductive or insulating packaging surface of a semiconductor device 105. In a specific embodiment, a $LiCoO_2$ cathode layer is deposited on semiconducting surface or the conductive or insulating packaging surface of a semiconductor device 105. A number of deposition techniques are known in the art, these include, but are not limited to reactive or non-reactive RF magnetron sputtering, reactive or non-reactive pulsed DC magnetron sputtering, reactive or non-reactive DC diode sputtering, reactive or non-reactive thermal (resistive) evaporation, reactive or non-reactive electron beam evaporation, ion-beam assisted deposition, plasma enhanced chemical vapor deposition, deposition methods, which may include, for example, spin coating, ink-jetting, thermal spray deposition, dip coating or the like. As part of the fabrication process for example, a post-deposition laser anneal may be used to improve the crystallization of the cathode layer 145 in order to fine-tune and optimize its chemical properties, such as its electrochemical potential, its energy, its power performance, and its reversible lattice parameters on electrochemical and thermal cycling. Examples of methods used to deposit $LiCoO_2$ are disclosed in U.S. patent application Ser. No. 11/557,383, filed on Nov. 7, 2006, which is incorporated herein by reference in its entirety.

The semiconducting surface or the conductive or insulating packaging surface of a semiconductor device in the above embodiments may be part of any integrated circuit and may include, memory devices, processors or other logic circuits.

Another embodiment of the present invention includes a battery deposited on a flexible printed circuit board including, for example, a first electrical contact; a bonding layer coupled with the first electrical contact and having an embedded conductor; at least one battery cell structure; and a flexible printed circuit board. A bonding layer and the at least one battery cell structure may be sandwiched between the first contact layer and the flexible printed circuit board. The bonding layer may be selectively conductive through the embedded conductor. The battery cell structure may further be in selective electrical contact with the first electrical contact via the embedded conductor.

Figure 3A:
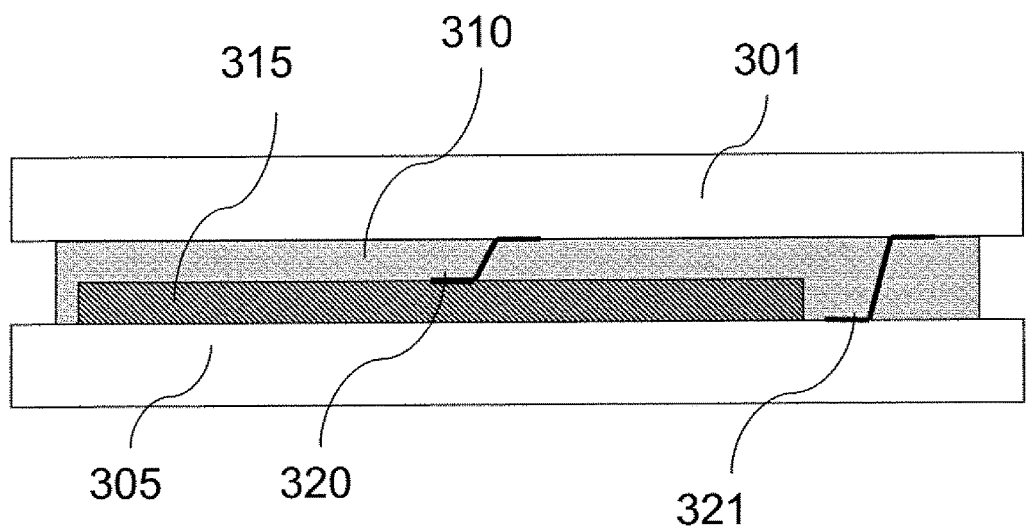
FIG. 3A shows a side view of an exemplary thin film battery on a semiconducting surface or the conductive or insulating packaging surface of a semiconductor device or a flexible printed circuit board according to another exemplary embodiment of the present invention.

FIG. 3A shows a side view of an electrochemical device according to another embodiment of the present invention. In this embodiment, a first contact 301 is coupled with bonding layer 310 with a portion of the first contact 301 extending past the bonding layer 310. The bonding layer 310 may, for example, be bonded with the cell structure 315. A flexible printed circuit board 305 is placed under the battery cell structure 315. Shown embedded within the bonding layer 310 is a first embedded conductor 320. This first embedded conductor 320, for example, creates a selectively conductive bonding layer. A selectively conductive bonding layer 310 permits conduction from the cell structure 315 through the bonding layer 310 to the first contact 301 at specific points, and yet provides insulation between the first contact 301 and the flexible circuit board 305. Also shown embedded within the bonding layer 310 is the second embedded conductor 321. This second conductor, for example, further creates a selectively conductive bonding layer. The further selectively conductive bonding layer 310 permits conduction from the flexible printed circuit board 305 through the bonding layer 310 to the first contact 301 at specific points, and yet provides insulation between the first contact 301 and the flexible printed circuit board 305. Other types of battery cell structures may be also be included.

Figure 3B:
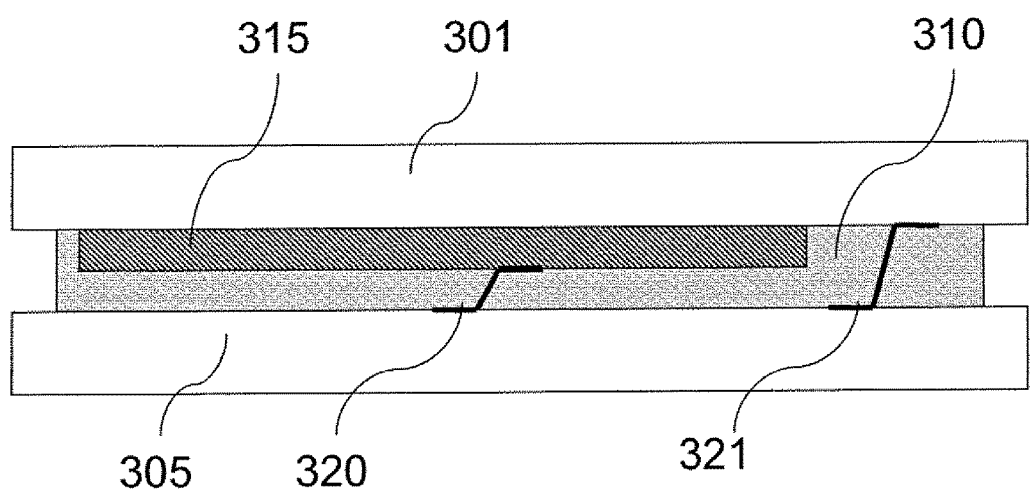
FIG. 3B shows a side view of an exemplary thin film battery on a semiconducting surface or the conductive or insulating surface of a semiconductor device or flexible printed circuit board according to another exemplary embodiment of the present invention.

FIG. 3B shows a side view of an electrochemical device according to one exemplary embodiment of the present invention. In this embodiment, a first contact 301 is coupled with the battery cell structure 315. A bonding layer 310 is coupled to the battery cell structure 315 and a portion of the first contact 301, which extends past the bonding layer 310. A flexible printed circuit board 305 is coupled with the bonding layer 310. Shown embedded within the bonding layer 310 is the first embedded conductor 320. This first embedded conductor 320, for example, creates a selectively conductive bonding layer. A selectively conductive bonding layer 310 permits conduction from the cell structure 315 through the bonding layer 310 to the flexible printed circuit board 305 at specific points, and yet provides insulation between the first contact 301 and the flexible printed circuit board 305. The electrochemical device may have a second embedded conductor 321 that selectively creates an electrical contact between the first contact 301 and the flexible printed circuit board 305. In this case, the flexible printed circuit board 305 must be selectively insulating between the contacts points at which the first embedded conductor 320 and the second embedded conductor 321 meet the flexible printed circuit board 305.

Figure 3C:
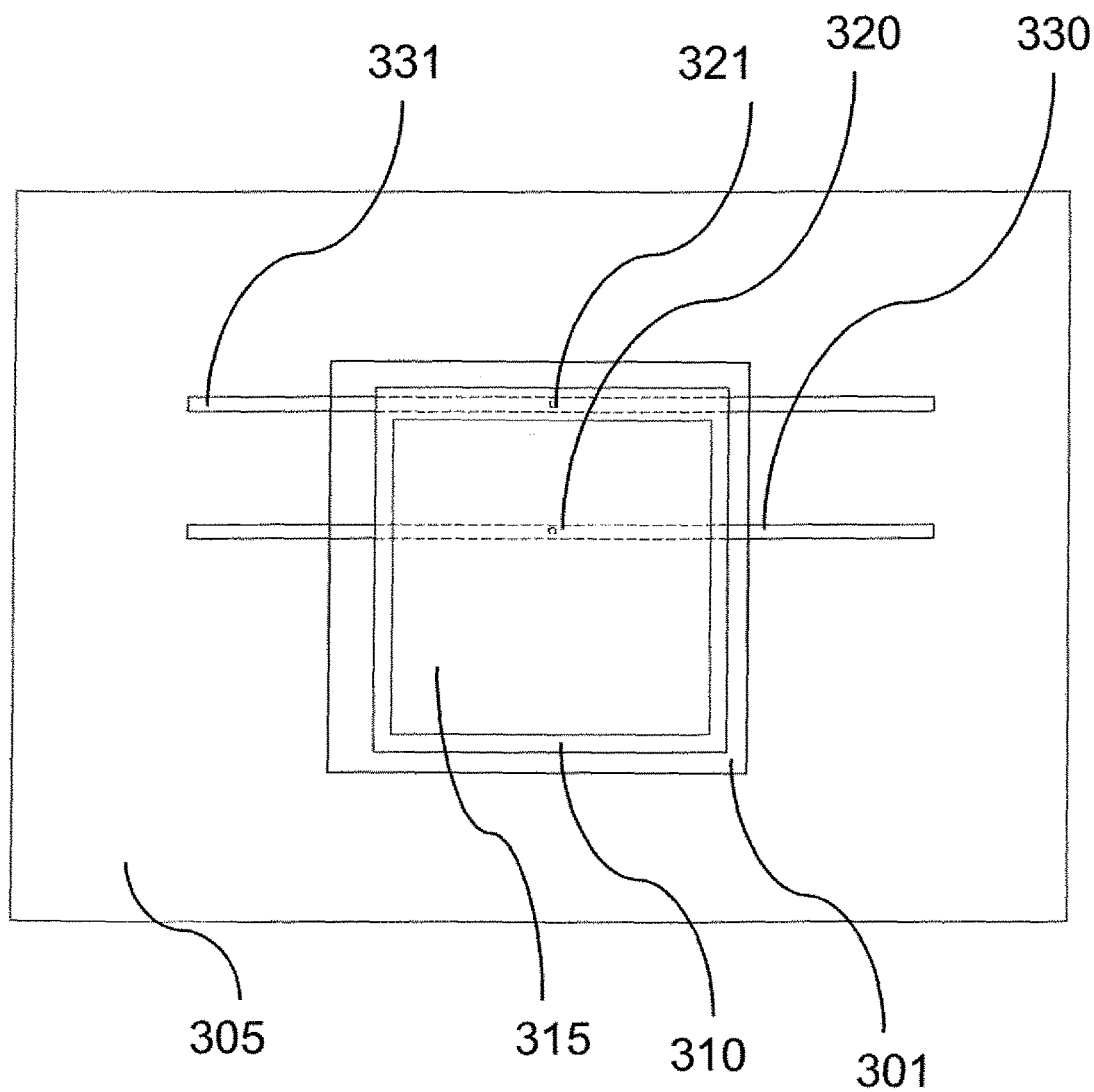
FIG. 3C shows a top view of an exemplary thin film battery on a semiconducting surface or the conductive or insulating surface of a semiconductor device or flexible printed circuit board according to another exemplary embodiment of the present invention.

FIG. 3C is a top view of an exemplary electrochemical device integrated with a flexible circuit board 305, such as the exemplary devices described above with respect to FIGS. 3A and 3B. As shown in FIG. 3C, conductive traces 330, 331 are formed on a surface of the circuit board 305. Other types of conductive surfaces, such as contact pads, wiring, exposed conductive vias etc., or combinations thereof may be provided on the circuit board surface to receive the electrochemical device. In the plan view, the first embedded conductor 320 is shown passing through bonding layer 310 to make electrical contact with conductive trace 330, and the second embedded conductor 321 is shown passing through bonding layer 310 to make electrical contact with conductive trace 331. It should be appreciated that an analogous arrangement can be achieved with respect to the examples including a semiconducting surface or the conductive or insulating packaging surface of a semiconductor device, as described above with respect to FIGS. 1A and 1B.

The flexible circuit board 305 may comprise, for example, multiple circuit board layers with and without traces, single or double sided, semi-rigid, a film, and/or a polyimide film.

The embedded conductors 320 and 321 may be placed within the bonding layer 310 in many different ways. For example, a metal tab, a metal wire, a metal strip, a metal ribbon, multiple metal wires, multiple metal strips, multiple metal ribbons, a metal wire mesh, perforated metal foil, perforated metal, a metal coating applied to the adhesive layer, a metallic disk, a metallically coated fiberglass or combinations thereof may be used. In each of these examples, the first embedded conductor 320 can provide selective electrical conduction between the cell structure 315 and the first contact 301 or the flexible printed circuit board 305, and yet provide insulation between the battery cell structure 315 and the first contact 301 or the flexible printed circuit board 305. Also in each of these examples, the second embedded conductor 321 can provide selective electrical conduction between the first contact 301 and the flexible printed circuit board 305 and yet provide insulation between the first contact 301 and the flexible printed circuit board 305. In some embodiments the first embedded conductor 320 may be woven within the bonding layer 310. The first embedded conductor 320 may be, for example, disks embedded within the bonding layer 310. In some embodiments slits within the bonding layer 310 may be made in order to weave or place the first embedded conductor 320 through the bonding layer 310. Also, for example, holes or other means may be used to place the first embedded conductor 320 through the bonding layer 310. In some embodiments the second embedded conductor 321 may be woven within the bonding layer 310. The second embedded conductor 321 may be, for example, disks embedded within the bonding layer 310. In some embodiments slits within the bonding layer 310 may be made in order to weave or place the second embedded conductor 321 through the bonding layer 310. Also, for example, holes or other means may be used to place the second embedded conductor 321 through the bonding layer 310.

The cell structure 315 may include a cathode, anode and electrolyte. For example, the cathode may comprise $LiCoO_2$, the anode may comprise lithium and the electrolyte may comprise LIPON. Other electrochemical devices may be used as needed.

The cell structure 315 may be coupled with the flexible printed circuit board 305 in a number of ways. In one embodiment, the cell structure 315, for example, may be coupled with the flexible printed circuit board 305 using glue. Glue, as used in this application, extends to any material that may adhere the cell structure 315 to the flexible printed circuit board 305. The glue may create either a mechanical or chemical bond between the two layers. Glue may also include chemically bonding the two layers without introducing another material or layer. Glue, for example, may include but is not limited to cement glue and resin glue. The glue may be electrically conducting, semi-conducting, or insulating.

The cell structure 315 may be coupled with the first electrical contact 301 in a number of ways. In one embodiment, the cell structure 315, for example, may be coupled with the first electrical contact 301 using glue. Glue, as used in this application, extends to any material that may adhere the cell structure 315 to the first electrical contact 301. The glue may create either a mechanical or chemical bond between the two layers. Glue may also include chemically bonding the two layers without introducing another material or layer. Glue, for example, may include but is not limited to cement glue and resin glue. The glue may be electrically conducting, semi-conducting, or insulating.

In another embodiment the flexible printed circuit board 305 acts as a substrate for the battery, which may be deposited thereon.

In another embodiment the first electrical contact 301 acts as a substrate for the battery, which may be deposited thereon.

In another embodiment the flexible printed circuit board 305 acts as an encapsulate for the battery.

In another embodiment the first electrical contact 301 acts as an encapsulate for the battery.

Figure 4A:
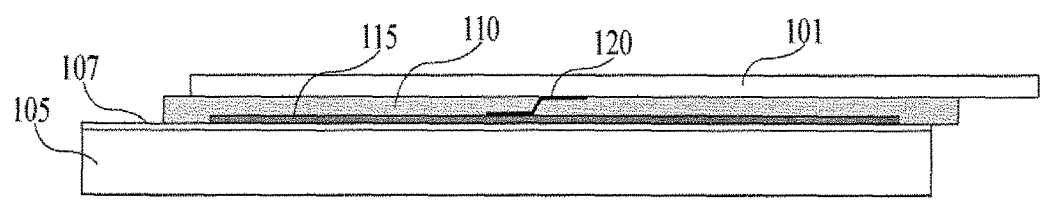
FIG. 4A shows a side view of an exemplary thin film battery on a semiconducting surface or the conductive or insulating surface of a semiconductor device according to another exemplary embodiment of the present invention.

In another exemplary embodiment shown in FIG. 4A, a thin film battery is provided on a semiconducting surface or the conductive or insulating surface of a semiconductor device with a barrier layer therebetween. Elements depicted in FIG. 4A like those above in FIG. 1A are shown having the same reference numbers. In this embodiment, a first contact 101 is coupled with bonding layer 110 with a portion of the first contact 101 extending past the bonding layer 110. The bonding layer 110 may, for example, be bonded with the cell structure 115. A semiconducting surface or the conductive or insulating (e.g., packaging) surface of a semiconductor device 105 with a barrier layer 107 is placed under the battery cell structure 115.

In this embodiment, barrier layer 107 may include, for example, titanium nitride. The barrier layer 107 may also comprise a semiconducting surface or the conductive or insulating packaging surface of a semiconductor device 105. A conductive surface may include, for example, a conductive contact pad, a conductive line, conductive via or other conductive layer formed on or at the device surface. A conductive surface also may be formed together with an insulating surface, such as a conductive surface formed on a packaging surface of a semiconductor device. An insulating surface of the semiconductor device 105 may be, for example, an insulating packaging surface of a semiconductor device or an upper insulating surface the semiconductor device. Shown embedded within the bonding layer 110 is the first embedded conductor 120. This first embedded conductor 120, for example, creates a selectively conductive bonding layer. A selectively conductive bonding layer 110 permits conduction from the cell structure 115 through the bonding layer 110 to the first contact 101 at specific points, and yet provides insulation between the first contact 101 and the barrier layer 107. Other types of battery cell structures may be also be included.

The cell structure 115 may be coupled with the semiconducting surface or the conductive or insulating (e.g., packaging) surface of a semiconductor device 105 and barrier layer 107 in a number of ways. In one embodiment, the electrochemical device, for example, may be coupled with the barrier layer using glue. Glue, as used in this application, extends to any material that may adhere the cell structure 115 to the barrier layer 107. The glue may create either a mechanical or chemical bond between the two layers. Glue may also include chemically bonding the two layers without introducing another material or layer. Glue, for example, may include but is not limited to cement glue and resin glue. The glue may be electrically conducting, semi-conducting, or insulating.

In another exemplary embodiment the semiconducting surface or the conductive or insulating packaging surface of a semiconductor device 105 acts as a substrate for the battery. The semiconducting surface or the conductive or insulating packaging surface of a semiconductor device 105 is provided and the barrier layer 107 may be deposited thereon. The barrier layer 107 may also be glued to the semiconducting surface or the conductive or insulating packaging surface of a semiconductor device 105. Once the barrier layer 107 and the semiconductor device 105 have been prepared, the cell structure 115 may be deposited directly on the barrier layer 107.

In an exemplary embodiment, a $LiCoO_2$ cathode layer is deposited on the barrier layer 107 by way of methods described above.

Figure 4B:
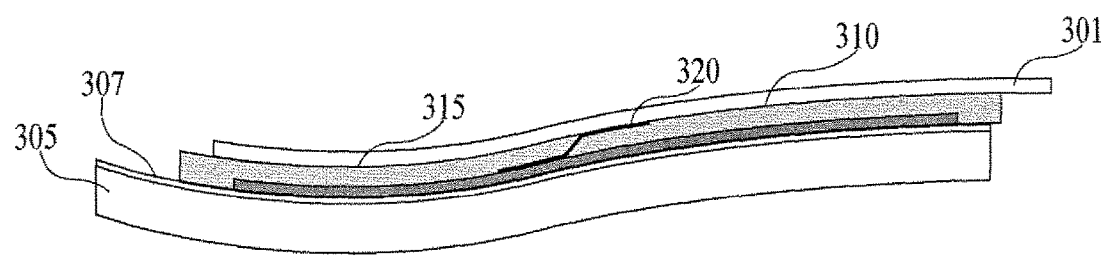
FIG. 4B shows a side view of an exemplary thin film battery on a flexible printed circuit board according to another exemplary embodiment of the present invention.

In yet another exemplary embodiment shown in FIG. 4B, a thin film battery is provided on a flexible circuit board. Elements depicted in FIG. 4B like those above in FIG. 3A are shown having the same reference numbers. In this embodiment, a first contact 301 is coupled with bonding layer 310 with a portion of the first contact 301 extending past the bonding layer 310. The bonding layer 310 may, for example, be bonded with the cell structure 315. A flexible printed circuit board 305, such as described above, and a barrier layer 307 is placed under the battery cell structure 315. In this embodiment, the barrier layer 307 may, for example, include titanium nitride. Shown embedded within the bonding layer 310 is first embedded conductor 320. This first embedded conductor 320, for example, creates a selectively conductive bonding layer. A selectively conductive bonding layer 310 permits conduction from the cell structure 315 through the bonding layer 310 to the first contact 301 at specific points, and yet provides insulation between the first contact 301 and the barrier layer 307. The first embedded conductor 320 may be provided within the bonding layer 310 as described above. In each of these examples, the first embedded conductor 320 can provide electrical conduction between the cell structure 315 and the first contact 301 and yet provide insulation between the first contact 301 and the barrier layer 307.

The cell structure 315 may be coupled with the semiconducting surface or the conductive or insulating packaging surface of a semiconductor device 305 and barrier layer 307 in a number of ways. In one embodiment, the electrochemical device, for example, may be coupled with the barrier layer using glue. Glue, as used in this application, extends to any material that may adhere the cell structure 315 to the barrier layer 307. The glue may create either a mechanical or chemical bond between the two layers. Glue may also include chemically bonding the two layers without introducing another material or layer. Glue, for example, may include but is not limited to cement glue and resin glue. The glue may be electrically conducting, semi-conducting, or insulating.

In another embodiment the flexible printed circuit board 305 acts as a substrate for the battery and the barrier layer 307 may be deposited thereon. The barrier layer 307 may also be glued to the flexible printed circuit board 305. Once the barrier layer 307 and the printed circuit board 305 have been prepared, the cell structure 315 may be deposited directly on the barrier layer 307.

While FIGS. 4A and 4B show only one first embedded conductor 120, 320, respectively, it is to be understood that exemplary embodiments also may include at least one second conductor, such as second embedded conductors 121, 321, respectively described above in connection with FIGS. 1A and 3A. Further, electrical connection between the first contact 101, 301 and the underlying semiconducting surface, conductive or insulating surface of a semiconductor device, or a flexible circuit board can be made by second embedded conductors 121, 321 through the bonding and/or barrier layers.

The above-discussed exemplary embodiments may also include multiple electrochemical devices stacked upon a semiconducting surface or the conductive or insulating (e.g., packaging) surface of a semiconductor device.

The above-discussed exemplary embodiments may also include multiple electrochemical devices stacked upon the first electrical contact 301.

The present exemplary embodiments provide alternative schemes to encapsulate the chemically and mechanically sensitive layers of electrochemical devices, which are less expensive than prior encapsulation schemes using gold foil. The above exemplary embodiments also avoid problems of other prior schemes relating to blow out of the seals of a metal and plastic pouch encapsulating an electrochemical device resulting from temperature changes, which cause the gas within the metal and plastic pouch to expand and/or contract.

The exemplary embodiments described herein also provide a rechargeable secondary battery directly fabricated on a semiconductor device such as an integrated circuit. Such batteries provide power during times when the circuit is powered off and are quickly and easily recharged when power resumes. Critical circuitry may benefit from localized power provided by such batteries. The exemplary embodiments also provide for less expensive and more reliable encapsulating approaches, and better approaches to providing electrically conductive contacts, including encapsulation that is substantially thinner than known encapsulation methods. The exemplary embodiments also provide flexible integrated circuits and/or flexible printed circuit boards with thin film flexible batteries coupled thereon.

Although the above examples describe a conductive material provided in an opening in the bonding layer, such as the slit, it should be appreciated that electrical contact between the battery cell structure 115, 315 and first electrical contact 101, 301 may be provided by a number of other ways. For example, embedding a conductive powder within an adhesive forming the bonding layer 110, 310 may provide electrical conduction between the cell structure 115, 315 and the first contact 101, 301. For example, a conductive powder such as a metallic powder (e.g., nickel powder) can be embedded in an adhesive bonding layer 110, 310 at one or more selected areas within an adhesive bonding layer 110, 310 and between the first contact 101, 301 and the battery cell structure 115, 315. Those skilled in the art will appreciate other conductive materials that may be provided for the selective conduction, such as conductive balls, slugs, wiring mesh etc. selectively provided within an adhesive. The ways to achieve electrical conduction between the battery cell structure 115, 315 and the first contact 101, 301 and yet provide insulation between the contacts and battery cell structure, should not be considered as limited to the examples explained herein.

The same holds true for the electrical contact between the battery cell structure 115, 315 and the semiconducting surface or the conductive or insulating packaging surface of a semiconductor device 105 or the flexible printed circuit board 305. The same also holds true for the electrical contact between the first contact 101, 301 and the semiconducting surface or the conductive or insulating packaging surface of a semiconductor device 105 or the flexible printed circuit board 305.

Additionally, it should be appreciated that the electrochemical device may comprise a discrete device (e.g., fully packaged with its own substrate and own encapsulation) on a semiconductor surface, a conducting or insulating surface of a semiconductor device or a flexible printed circuit board.

For example, prior to its integration onto the semiconducting surface or a conductive or insulating surface of a semiconductor device or into or onto a flexible printed circuit board, the electrochemical device may be fabricated as a discrete device, and then integrated as a whole together with its substrate and its encapsulation.

The embodiments described above are exemplary only. One skilled in the art may recognize variations from the embodiments specifically described here, which are intended to be within the scope of this disclosure. As such, the invention is limited only by the following claims. Thus, it is intended that the present invention cover the modifications of this invention provided they come within the scope of the appended claims and their equivalents.

What is claimed is:

1. An integrated circuit including a battery, comprising:
a semiconductor device having a surface;
a bonding layer coupled with the surface of the semiconductor device, the bonding layer comprising a first embedded conductor and a second embedded conductor;
a battery cell structure in selective electrical contact with the surface of the semiconductor device via the first embedded conductor; and
a first electrical contact having a lower surface to which the battery cell structure is directly attached, wherein the bonding layer and the battery cell structure are sandwiched between the surface of the semiconductor device and the lower surface of the first electrical contact, wherein the surface of the semiconductor device is in selective electrical contact with the first electrical contact via the second embedded conductor being in direct contact with the lower surface of the first electrical contact to which the battery cell structure is directly attached.

2. The integrated circuit of claim 1, wherein both the first embedded conductor and the second embedded conductor directly contact the surface of the semiconductor device.

3. The integrated circuit of claim 1, wherein the first electrical contact comprises an encapsulate metal.

4. The integrated circuit of claim 1, wherein the bonding layer comprises a material selected from a group consisting of an adhesive material, an insulating material, plastic, glass, reinforcement materials, and fiberglass.

5. The integrated circuit of claim 1, wherein each of the first embedded conductor and the second embedded conductor is selected from a group consisting of a tab, a wire, a metal strip, a metal ribbon, multiple wires, multiple metal strips, multiple metal ribbons, a wire mesh, a perforated metal, a metal coating applied to an adhesive layer, and a disk.

6. The integrated circuit of claim 1, wherein the battery cell structure is deposited on the first electrical contact.

7. The integrated circuit of claim 1, wherein the surface of the semiconductor device is selected from a group consisting of a semiconducting surface, a conductive surface, and an insulating packaging surface.

8. The integrated circuit of claim 7, wherein the surface of the semiconductor device acts as an encapsulate of the battery cell structure.

9. The integrated circuit of claim 1, wherein the first embedded conductor and the second embedded conductor are woven within the bonding layer.

10. The integrated circuit of claim 9, wherein the bonding layer comprises a slit within which the first embedded conductor is woven.

11. A method of manufacturing a battery on a first electrical contact comprising:
- creating a selectively conductive bonding layer, the bonding layer comprising a first embedded conductor and a second embedded conductor;
- coupling the bonding layer with an upper horizontal surface of a semiconductor device, wherein both the first embedded conductor and the second embedded conductor directly contact the upper horizontal surface of the semiconductor device;
- directly attaching a first side of a battery cell structure to a lower surface of the first electrical contact; and
- coupling a second side of the battery cell structure with the bonding layer, wherein the second side of the battery cell structure is in direct contact with the first embedded conductor; and wherein the upper horizontal surface of the semiconductor device is in selective electrical contact with the first electrical contact via the second embedded conductor being in direct contact with the lower surface of the first electrical contact to which the first side of the battery cell structure is directly attached.

12. The method of claim 11, wherein the upper horizontal surface of the semiconductor device, with which the bonding layer is coupled, is one of a semiconducting surface, a conductive surface or an insulating surface.

13. The method of claim 11, wherein directly attaching the first side of the battery cell structure to the lower surface of the first electrical contact comprises depositing the battery cell structure on the first electrical contact.

* * * * *